United States Patent
Kim et al.

(10) Patent No.: US 9,543,307 B2
(45) Date of Patent: Jan. 10, 2017

(54) VERTICAL MEMORY DEVICES AND METHODS OF MANUFACTURING THE SAME

(71) Applicants: Ha-Na Kim, Seoul (KR); Dae-Hyun Jang, Suwon-si (KR); Jung-Ik Oh, Hwaseong-si (KR)

(72) Inventors: Ha-Na Kim, Seoul (KR); Dae-Hyun Jang, Suwon-si (KR); Jung-Ik Oh, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/792,114

(22) Filed: Jul. 6, 2015

(65) Prior Publication Data

US 2016/0133630 A1 May 12, 2016

(30) Foreign Application Priority Data

Nov. 6, 2014 (KR) .................. 10-2014-0153738

(51) Int. Cl.
*H01L 21/02* (2006.01)
*H01L 21/48* (2006.01)
*H01L 27/105* (2006.01)
*H01L 27/02* (2006.01)

(52) U.S. Cl.
CPC ......... *H01L 27/1052* (2013.01); *H01L 21/481* (2013.01); *H01L 21/486* (2013.01); *H01L 21/4846* (2013.01); *H01L 27/0207* (2013.01)

(58) Field of Classification Search
CPC ............... H01L 21/768; H01L 21/7684; H01L 21/76819; H01L 21/76877; H01L 21/76885; H01L 21/31053
USPC ................ 438/631, 261, 268, 270, 478, 703
See application file for complete search history.

(56) References Cited

U.S. PATENT DOCUMENTS

| | | | |
|---|---|---|---|
| 7,799,672 B2 | 9/2010 | Hashimoto et al. |
| 7,927,967 B2 | 4/2011 | Nomura et al. |
| 8,207,029 B2 | 6/2012 | Ishikawa |
| 8,563,378 B2 | 10/2013 | Shim et al. |
| 8,574,992 B2 | 11/2013 | Chen et al. |
| 8,741,761 B2 | 6/2014 | Lee et al. |
| 8,879,321 B2 | 11/2014 | Hwang et al. |
| 8,916,922 B2 | 12/2014 | Jang et al. |

(Continued)

FOREIGN PATENT DOCUMENTS

| | | |
|---|---|---|
| JP | 2010135672 A | 6/2010 |
| JP | 2010177652 A | 8/2010 |

(Continued)

*Primary Examiner* — Chuong A Luu
(74) *Attorney, Agent, or Firm* — Harness, Dickey & Pierce, PLC

(57) ABSTRACT

A method of manufacturing a vertical memory device includes: providing a substrate including a cell array region and a peripheral circuit region; forming a mold structure in the cell array region; forming a mold protection film in a portion of the cell array region and the peripheral circuit region, the mold protection film contacting the mold structure; forming an opening for a common source line that passes through the mold structure and extends in a first direction perpendicular to a top surface of the substrate; forming a peripheral circuit contact hole that passes through the mold protection film and extends in the first direction in the peripheral circuit region; and simultaneously forming a first contact plug and a second contact plug, respectively, in the opening for the common source line and in the peripheral circuit contact hole.

20 Claims, 21 Drawing Sheets

(56) References Cited

U.S. PATENT DOCUMENTS

| | | | |
|---|---|---|---|
| 2009/0310425 A1* | 12/2009 | Sim | H01L 27/11526 365/185.29 |
| 2010/0254191 A1* | 10/2010 | Son | H01L 27/0207 365/185.05 |
| 2011/0281379 A1* | 11/2011 | Yang | H01L 21/02071 438/16 |
| 2012/0164831 A1 | 6/2012 | Kim et al. | |
| 2014/0231899 A1 | 8/2014 | Lee et al. | |
| 2015/0011064 A1 | 1/2015 | Hwang et al. | |
| 2015/0162343 A1* | 6/2015 | Park | H01L 27/11582 257/329 |
| 2015/0372000 A1* | 12/2015 | Jee | H01L 27/11573 257/314 |

FOREIGN PATENT DOCUMENTS

| | | |
|---|---|---|
| JP | 2010192646 A | 9/2010 |
| KR | 20050108141 A | 11/2005 |
| KR | 20100034612 A | 4/2010 |
| KR | 1020110003764 U | 1/2011 |
| KR | 20110138951 A | 12/2011 |
| KR | 101166120 B1 | 7/2012 |
| KR | 20120073394 A | 7/2012 |
| KR | 20140035084 A | 3/2014 |

* cited by examiner

VERTICAL MEMORY DEVICES AND METHODS OF MANUFACTURING THE SAME

CROSS-REFERENCE TO RELATED APPLICATION

This application claims the benefit of Korean Patent Application No. 10-2014-0153738, filed on Nov. 6, 2014, in the Korean Intellectual Property Office, the disclosure of which is incorporated herein in its entirety by reference.

BACKGROUND

Example embodiments of the inventive concept relate to vertical memory devices and methods of manufacturing the same, and/or more particularly, to vertical memory devices having a channel vertical to a top surface of a substrate, and methods of manufacturing the same.

In order for high integration of memory devices, extensive research has been conducted to develop vertical memory devices in which memory cells are stacked vertically to a top surface of a substrate. A cell array region of a vertical memory device includes a pillar or a cylindrical channel protruding vertically to a top surface of a substrate, a plurality of gate lines contacting the channel, and a common source line contact plug that separates the plurality of gate lines. In addition, a peripheral circuit region of the vertical memory device includes a plurality of contact plugs. In manufacturing the vertical memory device, if a process of forming the common source line contact plug in the cell array region and a process of forming the plurality of contact plugs in the peripheral region are separately performed in sequence, a manufacturing process may become complicated and the common source line contact plug may swell in a process of forming an insulating film covering the common source line contact line.

SUMMARY

Some example embodiments of the inventive concept provide vertical memory devices having improved reliability.

Other example embodiments of the inventive concept provide methods of manufacturing a vertical memory device having improved reliability.

According to some example embodiments of the inventive concept, there is provided a method of manufacturing a vertical memory device, including providing a substrate including a cell array region and a peripheral circuit region, forming a mold structure in the cell array region, forming a mold protection film in a portion of the cell array region and in the peripheral circuit region, the mold protection film contacting the mold structure, forming an opening for a common source line that passes through the mold structure and extends in a first direction perpendicular to a top surface of the substrate, forming a peripheral circuit contact hole that passes through the mold protection film and extends in the first direction in the peripheral circuit region, and simultaneously forming a first contact plug and a second contact plug, respectively, in the opening for the common source line and in the peripheral circuit contact hole.

The forming of the mold protection film may be performed such that a top surface of the mold protection film is positioned on substantially a same plane as a top surface of the mold structure, and the simultaneous forming of the first contact plug and the second contact plug may be performed such that a top surface of the first contact plug and a top surface of the second contact plug are positioned on a substantially a same plane.

The forming of the mold structure may include forming a plurality of interlayer insulating films and a plurality of sacrificial films that are alternately stacked in the cell array region along the first direction.

The forming of the opening for the common source line may include forming a plurality of interlayer insulating film patterns and a plurality of sacrificial film patterns from the plurality of interlayer insulating films and the plurality of sacrificial films, respectively, and the method may further include: removing the plurality of sacrificial film patterns to form space regions between respective interlayer insulating film patterns, and forming a plurality of cell gate lines in the space regions.

The method may further include: forming a cell gate line contact hole that passes through the mold protection film and at least a portion of the plurality of interlayer insulating film patterns in the cell array region and partially exposes the plurality of cell gate lines, and forming a third contact plug in the cell gate line contact hole, wherein the forming of the third contact plug is performed at a same time as the forming of the first contact plug and the second contact plug.

The method may further include, after the forming of the opening for the common source line: forming a first hard mask pattern on the substrate such that a first void is formed in the opening for the common source line, forming the cell gate line contact hole by using the first hard mask pattern as an etching mask, removing the first hard mask pattern from the substrate, forming a second hard mask pattern on the substrate such that a second void is formed in the opening for the common source line and a third void is formed in the cell gate line contact hole, and forming the peripheral circuit contact hole by using the second hard mask pattern as an etching mask.

The method may further include, after the forming of the opening for the common source line, forming a first hard mask pattern on the substrate such that a first void is formed in the opening for the common source line, wherein the forming of the cell gate line contact hole and the forming of the peripheral circuit contact hole are performed by using the first hard mask pattern as an etching mask.

The method may further include, after the forming of the opening for the common source line and the forming of the cell gate line contact hole, forming a first hard mask pattern on the substrate such that a first void is formed in the opening for the common source line and a second void is formed in the cell gate line contact hole, wherein the forming of the peripheral circuit contact hole is performed by using the first hard mask pattern as an etching mask.

The forming of the opening for the common source line, the forming of the cell gate line contact hole, and the forming of the peripheral circuit contact hole may be simultaneously performed.

The simultaneous forming of the first contact plug, the second contact plug, and the third contact plug may include: forming a conductive layer that fills the cell gate line contact hole, the opening for the common source line, and the peripheral circuit contact hole, and planarizing the conductive layer such that a top surface of at least one of the mold structure and the mold protection film is exposed.

The forming of the third contact plug may be performed such that a top surface of the third contact plug is positioned on substantially a same plane as the top surface of the first contact plug and the top surface of the second contact plug.

The method may further include, after the forming of the plurality of cell gate lines, forming a separation film pattern on a sidewall of the opening for the common source line, so as to cover sidewalls of the plurality of cell gate lines.

The method may further include, forming an impurity region on an upper portion of the substrate exposed by the opening for the common source line, wherein the forming of the impurity region includes a primary impurity implantation process performed after the forming of the opening for the common source line, and a second impurity implantation process performed after the forming of the separation film pattern.

The method may further include, forming channels that pass through the mold structure and extend in the first direction, wherein the plurality of cell gate lines are formed to surround the channels.

The forming of the opening for the common source line may include forming the opening for the common source line, which passes through the mold structure between the channels and extends in the first direction.

The method may further include forming a dielectric film between the channels and the plurality of cell gate lines.

According to other example embodiments of the inventive concept, there is provided a method of manufacturing a vertical memory device, including providing a substrate including a cell array region and a peripheral circuit region, forming a mold structure in the cell array region, forming a mold protection film in a portion of the cell array region and in the peripheral circuit region, the mold protection film contacting the mold structure, forming an opening for a common source line passing through the mold structure and extending in a first direction perpendicular to a top surface of the substrate, forming a plurality of cell gate line contact holes passing through a portion of the mold structure and the mold protection film in the cell array region and extending in the first direction, forming a peripheral circuit contact hole passing through the mold protection film and extending in the first direction in the peripheral circuit region, and, simultaneously forming a common source line contact plug in the opening for a common source line, a plurality of cell gate line contact plugs in the respective cell gate line contact holes, and a peripheral circuit contact plug in the peripheral circuit contact hole.

The opening for the common source line is formed to extend in a second direction perpendicular to the first direction.

The simultaneously forming a common source line contact plug, a plurality of cell gate line contact plug, and a peripheral circuit contact plug is performed such that a top surface of the common source line contact plug is disposed at substantially the same plane as a top surface of each cell gate line contact plug and a top surface of the peripheral circuit contact plug.

The simultaneously forming a common source line contact plug, a plurality of cell gate line contact plug, and a peripheral circuit contact plug is performed such that the top surface of the common source line contact plug, the top surface of each cell gate line contact plug, and the top surface of the peripheral circuit contact plug are disposed at substantially the same plane as at least one of a top surface of the mold structure and a top surface of the mold protection film.

According to further example embodiments of the inventive concept, there is provided a vertical memory device including: a substrate including a cell array region and a peripheral circuit region, a gate stack structure in the cell array region, a mold protection film contacting the gate stack structure in a portion of the cell array region and in the peripheral circuit region, a common source line contact plug that passes through the gate stack structure and extends in a first direction perpendicular to a top surface of the substrate, and a peripheral circuit contact plug that passes through the mold protection film in the peripheral circuit region and extends in the first direction, wherein a top surface of the peripheral circuit contact plug is positioned on substantially a same plane as a top surface of the common source line contact plug.

A top surface of the gate stack structure may be positioned on substantially a same plane as a top surface of the mold protection film.

The gate stack structure may include a plurality of interlayer insulating film patterns formed on the substrate and spaced apart from one another in the first direction, and a plurality of cell gate lines disposed between respective interlayer insulating film patterns, the memory device may further include a cell gate line contact plug that passes through the mold protection film and at least a portion of the plurality of interlayer insulating film patterns in the cell array region and is connected to at least a portion of the plurality of cell gate lines, and a top surface of the cell gate line contact plug may be positioned on substantially a same plane as the top surface of the common source line contact plug and the top surface of the peripheral circuit contact plug.

The top surface of the common source line contact plug, the top surface of the cell gate line contact plug, and the top surface of the peripheral circuit contact plug may be positioned on substantially a same plane as at least one of the top surface of the gate stack structure and the top surface of the mold protection film.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
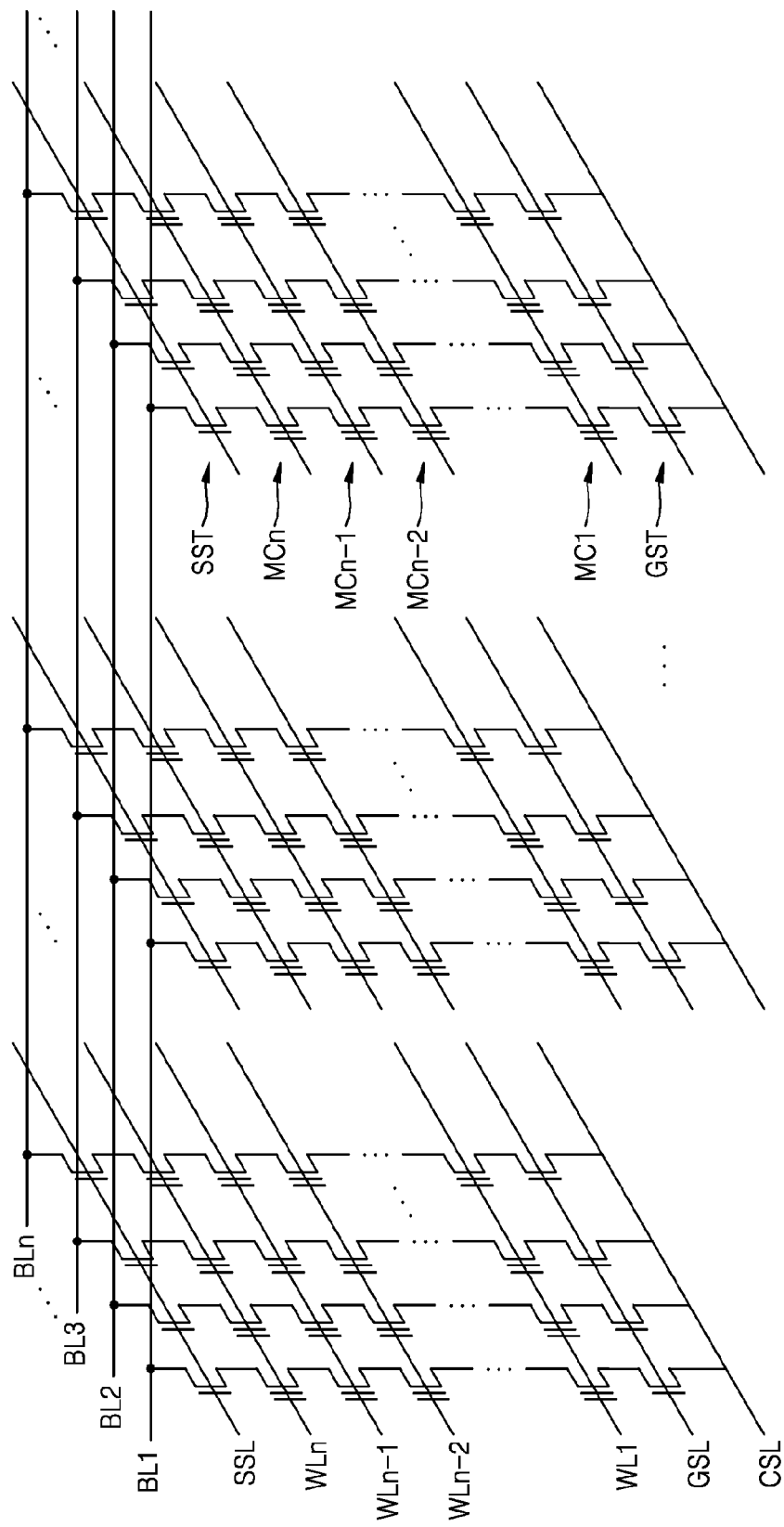
FIG. 1 is an equivalent circuit diagram of a memory cell array of a vertical memory device, according to example embodiments.

Hereinafter, embodiments of the inventive concept will be described with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated or reduced for clarity of the inventive concept.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Example embodiments of the inventive concept will be described in detail with reference to the accompanying drawings.

FIG. 1 is an equivalent circuit diagram illustrating a three-dimensional configuration of a memory cell array included in a vertical memory device, according to example embodiments.

Referring to FIG. 1, the memory cell array may include a plurality of memory cell strings, each of which includes n memory cells MC1 to MCn connected in series, and a ground selection transistor (GST) and a string selection transistor (SST) respectively connected in series to both ends of the n memory cells MC1 to MCn.

The n memory cells MC1 to MCn connected in series may be connected to respective word lines WL1 to WLn so as to select at least one of the n memory cells MC1 to MCn.

A gate terminal of the ground selection transistor GST may be connected to a ground selection line GSL, and a source terminal of the ground selection transistor GST may be connected to a common source line CSL. A gate terminal of the string selection transistor SST may be connected to a string selection line SSL, and a source terminal of the string selection transistor SST may be connected to a drain terminal of the memory cell MCn.

Even though one ground selection transistors GST and one string selection transistors SST are illustrated in FIG. 1 as being connected to the n memory cells MC1 to MCn one by one, the plurality of ground selection transistors GST and/or the plurality of string selection transistors SST may be connected thereto.

Drain terminals of the string selection transistors SST may be respectively connected to bit lines BL1 to BLn. When a signal is applied to gate terminals of the string selection transistors SST through the string selection line SSL, signals applied through the bit lines BL1 to BLn are transferred to the n memory cells MC1 to MCn connected in series. In this manner, a data read operation or a data write operation may be performed. In addition, when a signal is applied to gate terminals of the ground selection transistors GST through the ground selection line GSL, an erase operation may be performed to erase charges stored in the n memory cells MC1 to MCn connected in series.

Figure 2:
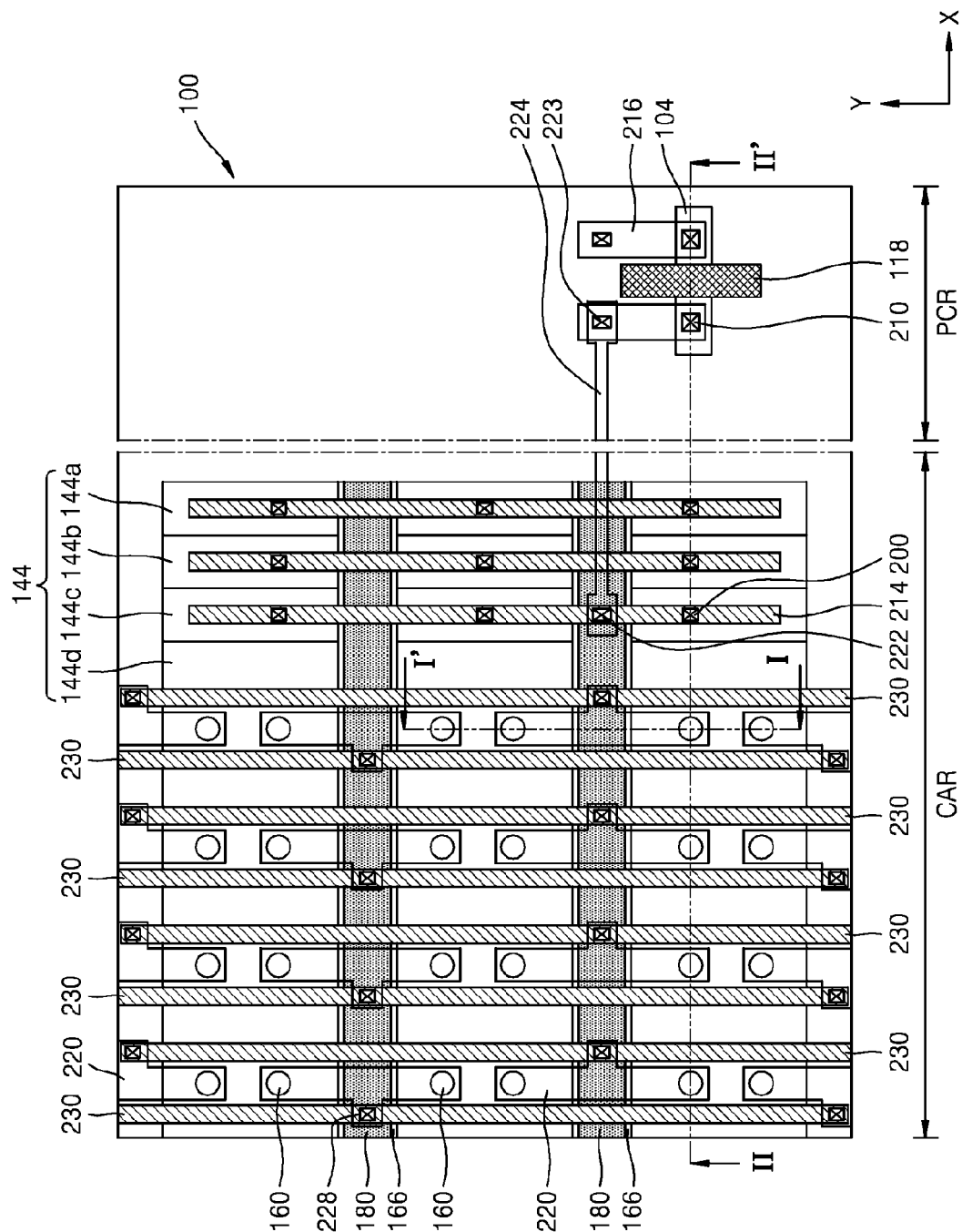
FIG. 2 is a plan view for describing a vertical memory device, according to example embodiments.
Figure 3A:
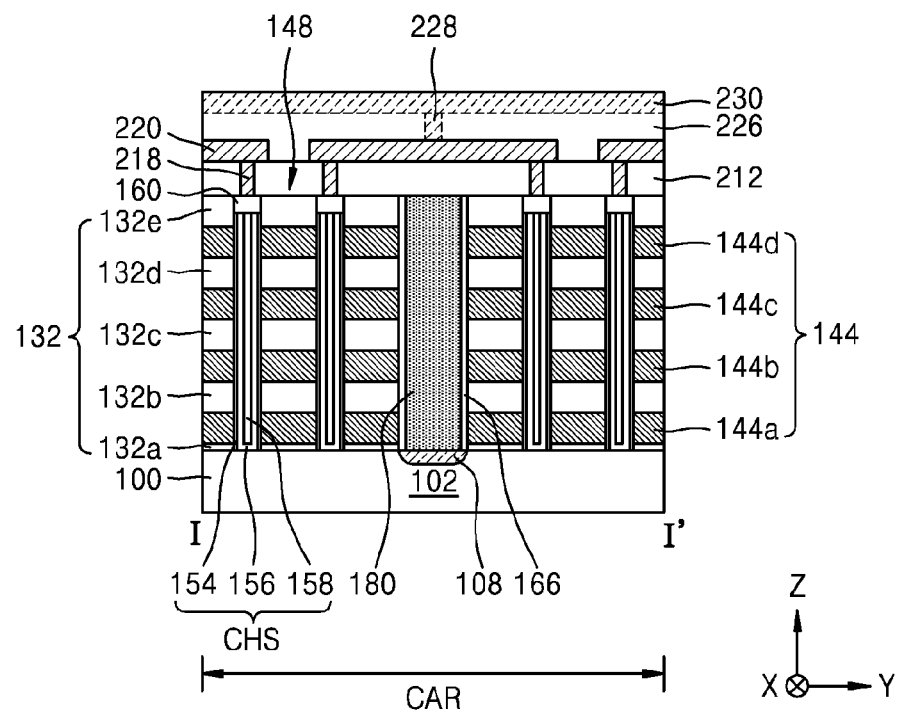
FIG. 3A is a cross-sectional view taken along line I-I' of FIG. 2.

FIG. 2 is a plan view for describing a vertical memory device, according to example embodiments. FIG. 3A is a cross-sectional view taken along line I-I' of FIG. 2, and FIG. 3B is a cross-sectional view taken along line II-II' of FIG. 2.

Figure 3B:
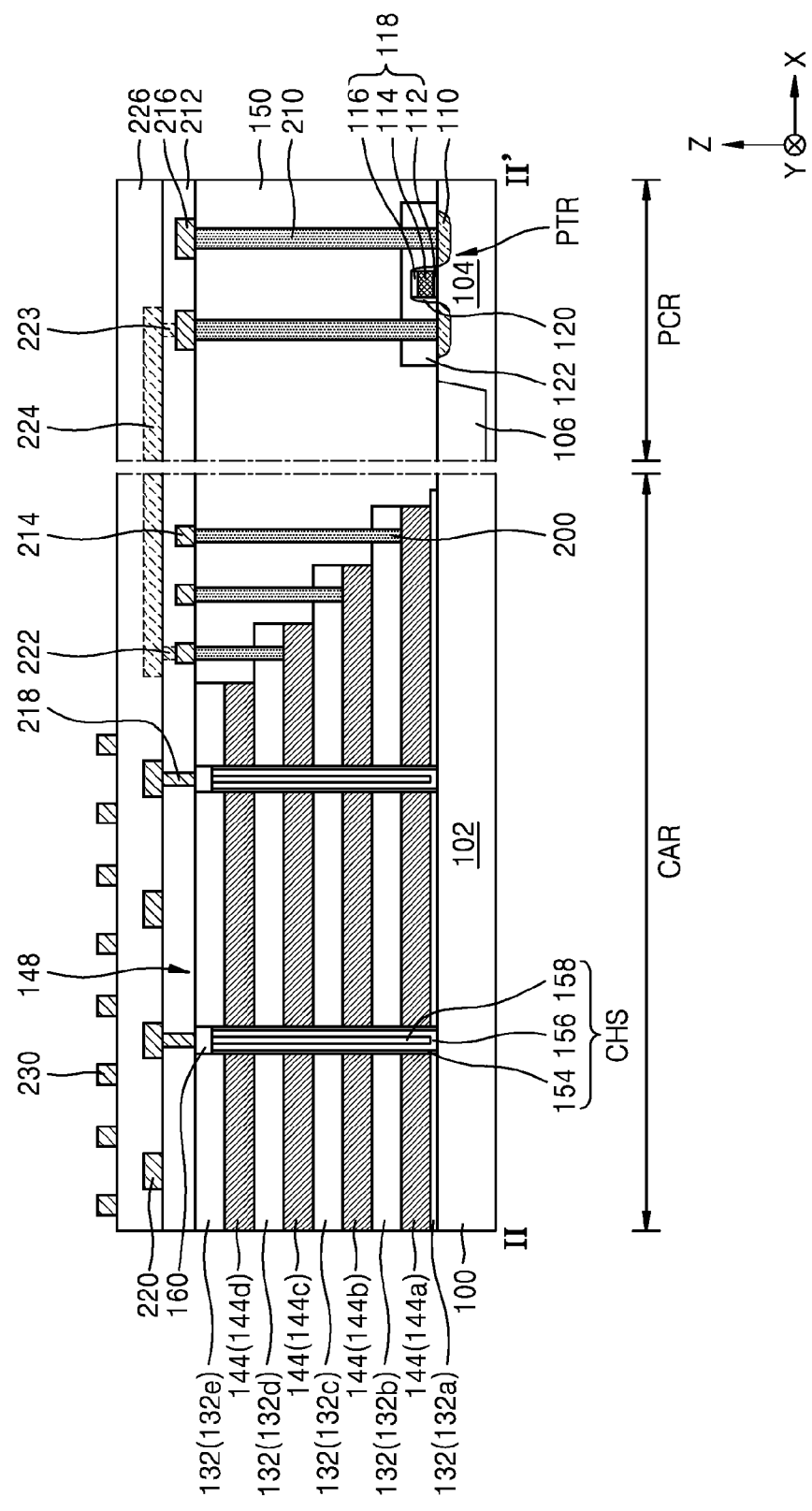
FIG. 3B is a cross-sectional view taken along line II-II' of FIG. 2.

In FIGS. 2, 3A, and 3B, a first direction (Z direction) is defined as a direction substantially vertical to a top surface of a substrate 100, and a second direction (X direction) and a third direction (Y direction) are respectively defined as two directions parallel to the top surface of the substrate 100 and intersecting with each other. For example, the second direction and the third direction may intersect substantially perpendicular to each other. The directions indicated by arrows on the drawings and opposite directions thereto are described as the same directions. The definitions of the above-described directions will be equally applied to all the accompanying drawings.

According to example embodiments, the substrate 100 may include, for example, a semiconductor material such as silicon or germanium. The substrate 100 may function as a p-type well of the vertical memory device. The substrate 100 may include a cell array region CAR and a peripheral circuit region PCR. The substrate 100 may include a device isolation region 106 delimiting active areas 102 and 104. The active areas 102 and 104 may include a first active area 102 delimited in the cell array region CAR, and a second active area 104 delimited in the peripheral circuit region PCR.

Referring to FIGS. 2, 3A, and 3B, the vertical memory device may include a cell gate stack structure 148 formed on the first active area 102 of the cell array region CAR. The cell gate stack structure 148 may include a plurality of interlayer insulating film patterns 132 (132a, 132b, 132c, 132d, and 132e) and a plurality of cell gate lines 144 (144a, 144b, 144c, and 144d). The plurality of interlayer insulating film patterns 132 (132a, 132b, 132c, 132d, and 132e) may extend in the second direction (X direction) on the substrate 100 and be spaced apart from one another in the first direction (Z direction) from the substrate 100. The plurality of cell gate lines 144 (144a, 144b, 144c, and 144d) may be respectively disposed between the respective interlayer insulating film patterns 132 (132a, 132b, 132c, 132d, and 132e). The cell gate lines 144 (144a, 144b, 144c, and 144d) may extend in the second direction (X direction) and be spaced apart from one another in the first direction (Z direction) from the substrate 100.

In some example embodiments, the lowermost interlayer insulation film pattern 132a may be disposed between the lowermost cell gate line 144a and the substrate 100, and the uppermost interlayer insulating film pattern 132e may be disposed on the uppermost cell gate line 144d.

In some example embodiments, the lowermost cell gate line 144a may be provided as the ground selection line GSL illustrated in FIG. 1, and the uppermost cell gate line 144d may be provided as the string selection line SSL illustrated in FIG. 1. The cell gate lines 144b and 144c, which are disposed between the ground selection line GSL and the string selection line SSL, may be provided as word lines WL.

Even though one ground selection line GSL, two word lines WL, and one string selection line SSL are illustrated in FIGS. 3A and 3B, the numbers of those are not limited thereto. For example, one or more of the ground selection line GSL and one or more of the string selection line SSL may be included, and $2^n$ word lines WL, for example, four, eight, or sixteen word lines WL may be included. The number of stacking of the cell gate lines 144a, 144b, 144c, and 144d may be determined in consideration of circuit design and/or integration degree of the vertical memory device.

Each of the cell gate lines 144a, 144b, 144c, and 144d may include a metal or a metal nitride. For example, each of the cell gate lines 144a, 144b, 144c, and 144d may include a metal and/or a metal nitride having a relatively low electrical resistance, such as tungsten, tungsten nitride, titanium, titanium nitride, tantalum, tantalum nitride, or platinum. In some example embodiments, each of the cell gate lines 144a, 144b, 144c, and 144d may have a multi-layered structure in which a barrier film including a metal nitride and a metal film are stacked.

The interlayer insulating film pattern 132 may include an oxide-based material such as silicon oxide ($SiO_2$), silicon oxycarbide (SiOC), or fluorinated silicon oxide (SiOF). The cell gate lines 144a, 144b, 144c, and 144d may be insulated from one another by the interlayer insulating film patterns 132.

As illustrated in FIGS. 3A and 3B, the cell gate lines 144a, 144b, 144c, and 144d and the interlayer insulating film patterns 132 may be stacked such that the length or width thereof is gradually reduced in the second direction (X direction) as away from the top surface of the substrate 100 in the first direction (Z direction). In some example embodiments, the cell gate lines 144a, 144b, 144c, and 144d and the interlayer insulating film patterns 132 may be stacked in the first direction (Z direction) in a pyramid shape or a step shape. Accordingly, the cell gate stack structure 148 may be a step-shaped stack structure.

Referring to FIGS. 2, 3A, and 3B, the vertical memory device may include a plurality of vertical channel structures CHS protruding and extending from the top surface of the substrate 100 in the first direction (Z direction). Each of the vertical channel structures CHS may include a channel 156, a dielectric film structure 154 surrounding an outer wall of the channel 156, and a buried film pattern 158 disposed within the channel 156.

In some example embodiments, the outer wall of the dielectric film structure 154 may be surrounded by the plurality of cell gate lines 144a, 144b, 144c, and 144d. The cell gate lines 144a, 144b, 144c, and 144d may be formed on the outer wall of the dielectric film structure 154 and be stacked to be spaced apart from one another in the first direction (Z direction). In some example embodiments, each of the cell gate lines 144a, 144b, 144c, and 144d may extend in the second direction (X direction) while partially surrounding the channels 156.

The channels 156 may be formed in the cell array region CAR and be in contact with the top surface of the substrate 100. The channels 156 may have a hollow cylinder shape or a cup shape. The channels 156 may include polysilicon or single-crystal silicon and may include a p-type impurity, for example, boron (B).

A buried film pattern 158 may be formed in an inner space of the channel 156. The buried film pattern 158 may have a pillar shape or a cylinder shape, the inside of which is fully filled. The buried film pattern 158 may include an insulating material such as silicon oxide. In some example embodiments, the channel 156 may have a pillar shape or a cylinder shape, the inside of which is fully filled. In this case, the buried film pattern 158 may be omitted.

Although not illustrated, the dielectric film structure 154 may include a tunnel insulating film, a charge storing film, and a blocking film, which are sequentially stacked from the outer wall of the channel 156. The blocking film may include a silicon oxide, and/or a metal oxide such as hafnium oxide, or aluminium oxide. The charge storing film may include a nitride, such as silicon nitride, and/or a metal oxide, and the tunnel insulating film may include an oxide such as silicon oxide. For example, the stack structure including the blocking film, the charge storing film, and the tunnel insulating film may have an oxide-nitride-oxide (ONO) structure in which an oxide film, a nitride film, and an oxide film are sequentially stacked.

In some example embodiments, a semiconductor pattern (not illustrated) may be further formed between the top surface of the substrate 100 and the bottom surface of the channel 156. In this case, the channel 156 may be provided on the top surface of the semiconductor pattern, and the dielectric film structure 154 may be provided on a peripheral portion of the top surface of the semiconductor pattern. The semiconductor pattern may include, for example, single-crystalline silicon or polysilicon.

On the other hand, in a case where the semiconductor pattern is disposed between the channel 156 and the substrate 100, the lowermost cell gate line 144a capable of functioning as the ground selection line GSL may extend while surrounding the outer wall of the semiconductor pattern. In this case, a gate insulating film (not illustrated) may be further formed between the cell gate line 144a and the outer wall of the semiconductor pattern.

A pad 160 may be formed on the dielectric film structure 154, the channel 156, and the buried film pattern 158. In some example embodiments, the pad 160 may cover the dielectric film structure 154, the channel 156, and the buried film pattern 158. The pad 160 may include polysilicon or single-crystalline silicon and may further include an n-type impurity, for example, phosphorus (P) or arsenic (As).

As illustrated in FIG. 2, a plurality of pads 160 may be arranged in the second direction (X direction) and the third direction (Y direction). Accordingly, in response to the arrangement of the pads 160, the plurality of vertical channel structures CHS each including the channel 156, the dielectric film structure 154, and the buried film pattern 158 may be arranged in the second direction (X direction) and the third direction (Y direction).

Referring to FIGS. 2, 3A, and 3B, the vertical memory device may include a common source line contact plug 180 that passes through the cell gate stack structure 148 and extends in the first direction (Z direction) perpendicular to the top surface of the substrate 100. The common source line contact plug 180 may have a line shape extending in the second direction (X direction). Two cell gate stack structures 148 may be spaced apart from each other, with the common source line contact plug 180 being disposed therebetween. The cell gate stack structures 148 may include cell gate line structures 144. Each of the cell gate line structures 144 may extend in the second direction (X direction) and include the plurality of cell gate lines 144a, 144b, 144c, and 144d.

As illustrated in FIG. 3A, a separation film pattern 166 that extends in the second direction (X direction) may be formed between the cell gate line structures 144 adjacent to each other in the third direction (Y direction). In some example embodiments, a plurality of separation film patterns 166 may be disposed along the third direction (Y direction) and electrically insulate the cell gate lines 144a, 144b, 144c, and 144d from the common source line contact plug 180. In this case, the common source line contact plug 180 and the separation film patterns 166 may extend in the second direction (X direction) and function as cell gate line cut patterns.

In some example embodiments, the common source line contact plug 180 may include a metal, a metal nitride, doped polysilicon, and combinations thereof. For example, the metal may include tungsten (W).

In some example embodiments, the separation film pattern 166 may include an insulating material such as silicon oxide.

As illustrated in FIG. 3A, a first impurity region 108 may be formed at the first active area 102 of the substrate adjacent to the common source line contact plug 180. The first impurity region 108 may extend in the second direction (X direction) and be provided as the common source line CSL of the vertical memory device. The first impurity region 108 may include an n-type impurity, for example, phosphorus (P) or arsenic (As). Although not illustrated, a metal silicide pattern, such as a cobalt silicide pattern or a nickel silicide pattern, may be formed on the first impurity region 108, so as to reduce a contact resistance between the common source line contact plug 180 and the first impurity region 108.

In some example embodiments, a peripheral circuit of the vertical memory device may be formed in the peripheral circuit region PCR of the substrate 100. The peripheral circuit may include, for example, transistors, wirings, or contacts. For example, a peripheral circuit gate structure 118 may be formed on the second active area 104 of the peripheral circuit region PCR. The peripheral circuit gate structure 118 may include a peripheral circuit gate insulating film pattern 112, a peripheral circuit gate electrode 114, and a peripheral circuit gate capping layer 116, which are sequentially stacked on the substrate 100. A second impurity region 110 may be formed at the second active area 104 adjacent to the peripheral circuit gate structure 118. The peripheral circuit gate structure 118 and the second impurity region 110 may constitute a transistor PTR. In this case, the second impurity region 110 may be provided as a source/drain region of the transistor PTR. In some example embodiments, a peripheral circuit gate spacer 120 may be further formed to cover sidewalls of the peripheral circuit gate structure 118.

In some example embodiments, a peripheral circuit protection film 122 may be formed on the substrate 100 of the peripheral circuit region PCR and cover the peripheral circuit gate structure 118, the peripheral circuit gate spacer 120, and the second impurity region 110. Accordingly, the peripheral circuit, such as the transistor PTR, may be protected by the peripheral circuit protection film 122.

In some example embodiments, the vertical memory device may include a mold protection film 150 formed on the substrate 100 in a portion of the first active area 102 of the cell array region CAR and in the peripheral circuit region PCR. The mold protection film 150 may cover the side of the step-shaped cell gate stack structure 148 and the peripheral circuit protection film 122. The mold protection film 150 may have a reverse-step-shaped side that contacts the side of the step-shaped cell gate stack structure 148 in a self-aligned manner. The top surface of the cell gate stack structure 148 may be positioned on substantially the same plane as the top surface of the mold protection film 150. In some example embodiments, the top surface of the uppermost interlayer insulating film pattern 132e of the cell gate stack structure 148 may be positioned on substantially the same plane as the top surface of the mold protection film 150. The mold protection film 150 may include, for example, an insulating material such as silicon oxide.

In some example embodiments, the top surface of the common source line contact plug 180 may be positioned on substantially the same plane as the top surface of the pad 160, the mold protection film 150 and/or the cell gate stack structure 148. In some example embodiments, the top surface of the common source line contact plug 180 may be positioned on substantially the same plane as the top surface of the uppermost interlayer insulating film pattern 132e of the cell gate stack structure 148.

In some example embodiments, the vertical memory device may include a plurality of cell gate line contact plugs 200 that pass through the mold protection film 150 and the interlayer insulating film patterns 132 formed in the cell array region CAR adjacent to the peripheral circuit region PCR and extend in the first direction (Z direction). The cell gate line contact plugs 200 may contact the cell gate lines 144a, 144b, 144c, and 144d, respectively. For convenience, the cell gate line contact plug 200 contacting the uppermost cell gate line 144d is not illustrated in FIGS. 2 and 3, but the vertical memory device may include the cell gate line contact plug 200 contacting the uppermost cell gate line 144d.

In some example embodiments, the top surfaces of the cell gate line contact plugs 200 may be positioned on substantially the same plane as the top surface of the common source line contact plug 180.

In some example embodiments, the vertical memory device may include peripheral circuit contact plugs 210 that pass through the mold protection film 150 and the peripheral circuit protection film 122 of the peripheral circuit region PCR and extend in the first direction (Z direction). The peripheral circuit contact plugs 210 may contact or be electrically connected to the second impurity region 110.

In some example embodiments, the top surfaces of the peripheral circuit contact plugs 210 may be positioned on substantially the same plane as the top surfaces of the cell gate line contact plugs 200.

In some example embodiments, the top surfaces of the common source line contact plug 180, the cell gate line contact plugs 200, and the peripheral circuit contact plugs 210 may be positioned on substantially the same plane as the top surface of the cell gate stack structure 148 and/or the top surface of the mold protection film 150.

In some example embodiments, the vertical memory device may include cell gate line contact wirings 214 that are electrically connected to the cell gate line contact plugs 200 on the mold protection film 150. As illustrated in FIG. 2, the cell gate line contact wirings 214 may extend in the third direction (Y direction) and be electrically connected to the plurality of cell gate line contact plugs 200 contacting the cell gate lines 144a, 144b, 144c, and 144d of the different cell gate line structures 144.

In some example embodiments, the vertical memory device may include peripheral circuit contact wirings 216 that are electrically connected to the peripheral circuit contact plugs 210 on the mold protection film 150.

In some example embodiments, a first upper insulating film 212 may be formed on the cell gate stack structure 148 and the mold protection film 150. The first upper insulating film 212 may include, for example, an insulating material such as silicon oxide.

In some example embodiments, the vertical memory device may include a first connection contact 222 that passes through the first upper insulating film 212 and contacts the cell gate line contact wiring 214, a second connection contact 223 that passes through the first upper insulating film 212 and contacts the peripheral circuit contact wiring 216, and a connection wiring 224 that connects the first connection contact 222 and the second connection contact 223 on the first upper insulating film 212. In the configuration of FIG. 2, the first connection contact 222, the second connection contact 223, and the connection wiring 224 are not present in the cross-section taken along the line II-II' of FIG. 2. However, for convenience of explanation, the first connection contact 222, the second connection contact 223, and the connection wiring 224 are shown by dashed lines in FIG. 3B. The cell gate line contact plug 200 and the peripheral circuit contact plug 210 may be electrically connected to each other through the connection wiring 224.

In some example embodiments, auxiliary bit line contacts 218 that pass through the first upper insulating film 212 and contact the pads 160 may be formed in the cell array region CAR. Auxiliary bit lines 220 that contact the auxiliary bit line contacts 218 may be disposed on the first upper insulating film 212. As illustrated in FIG. 2, the auxiliary bit lines 220 may electrically connect at least two auxiliary bit line contacts 218 disposed on both sides the common source line contact plug 180.

In some example embodiments, a second upper insulating film 226 that covers the auxiliary bit lines 220 and the connection wirings 224 may be formed on the first upper insulating film 212.

In some example embodiments, as illustrated in FIG. 3A, the vertical memory device may include a bit line contact 228 that passes through the second upper insulating film 226 and contacts the auxiliary bit line 220, and a bit line 230 that is disposed on the second upper insulating film 226 and contacts the bit line contact 228. In the configuration of FIG. 2, the bit line contact 228 and the bit line 230 are not present in the cross-section taken along the line I-I' of FIG. 2. However, for convenience of explanation, the bit line contact 228 and the bit line 230 are shown by dashed lines in FIG. 3A. A plurality of bit lines 230 may extend in the third direction (Y direction) and be formed in the second direction (X direction). The bit lines 230 may be electrically connected to the plurality of pads 160 through the bit line contacts 228, the auxiliary bit lines 220, and the auxiliary bit line contacts 218.

In some example embodiments, the congestion of the bit lines 230 may be improved by using the auxiliary bit lines 220 as routing wirings.

FIGS. 4A to 12B are cross-sectional views for describing a method of manufacturing a vertical memory device, according to example embodiments. For example, FIGS. 4A to 12B are cross-sectional views for describing a method of manufacturing the vertical memory device illustrated in FIGS. 1 to 3B. FIGS. 4A, 5A, 7A, 8, 9A, 10A, 11A, and 12A are cross-sectional views of process procedures corresponding to the cross-sections taken along the line I-I' of FIG. 2. FIGS. 4B, 5B, 6, 7B, 9B, 10B, 11B, and 12B are cross-sectional views of process procedures corresponding to the cross-sections taken along the line II-II' of FIG. 2.

Figure 4A:
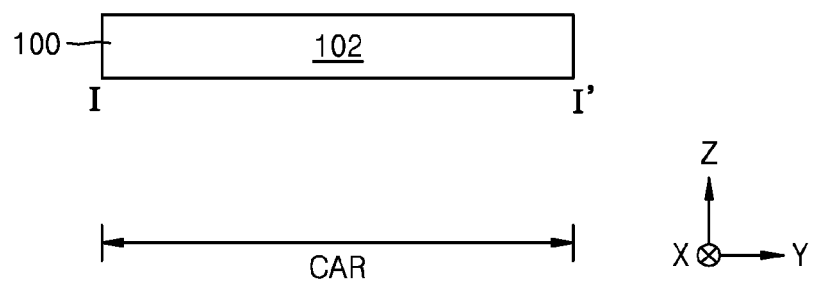
FIGS. 4A to 12B are cross-sectional views for describing a method of manufacturing a vertical memory device, according to example embodiments.
Figure 4B:
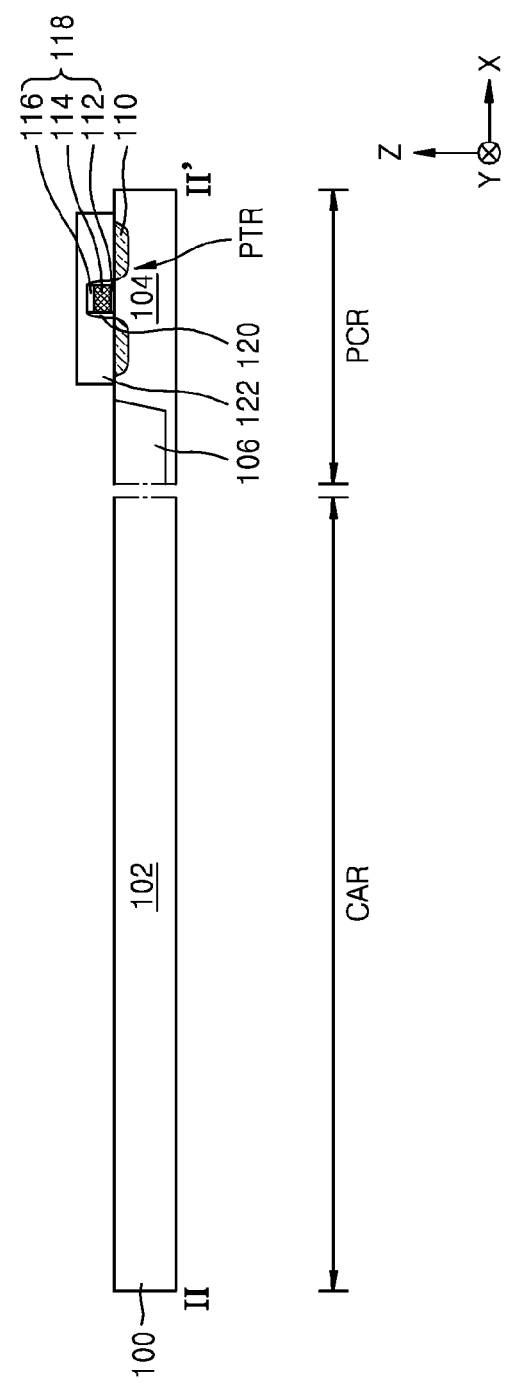

Referring to FIGS. 4A and 4B, a device isolation region 106 is formed to delimit active areas 102 and 104 in a substrate 100 including a cell array region CAR and a peripheral circuit region PCR. The active areas 102 and 104 may include the first active area 102 of the cell array region CAR and the second active area 104 of the peripheral circuit region PCR. Examples of the substrate 100 may include a semiconductor substrate including a semiconductor material such as single-crystal silicon or single-crystal germanium.

A peripheral circuit gate structure 118 and a second impurity region 110 are formed on the substrate 100 of the peripheral circuit region PCR. The peripheral circuit gate structure 118 may include a peripheral circuit gate insulating film pattern 112, a peripheral circuit gate electrode 114, and a peripheral circuit gate capping layer 116, which are sequentially stacked on the substrate 100. In some example embodiments, the peripheral circuit gate insulating film pattern 112 may be formed of silicon oxide and/or a metal oxide. The peripheral circuit gate electrode 114 may be formed of a metal nitride and/or doped polysilicon. The peripheral circuit gate capping layer 116 may be formed of silicon nitride. The peripheral circuit gate structure 118 and the second impurity region 110 may constitute a transistor PTR formed in the peripheral circuit region PCR.

In some example embodiments, a peripheral circuit gate spacer 120 may be further formed to cover both sidewalls of the peripheral circuit gate structure 118.

After that, a peripheral circuit protection film 122 may be further formed to protect the transistor PTR. For example, after a protection film is formed on the substrate 100 to cover the second impurity region 110, the peripheral circuit gate structure 118, and the peripheral circuit gate spacer 120, the peripheral circuit protection film 122 may be formed by removing the protection film formed on the cell array region CAR. The peripheral circuit protection film 122 may include an oxide film.

Figure 5A:
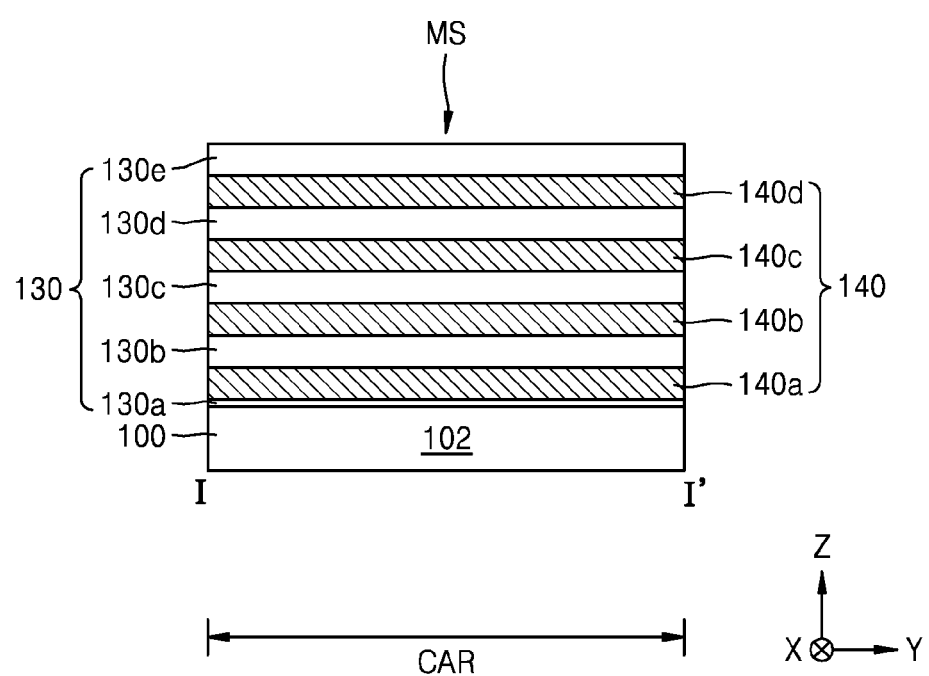
Figure 5B:
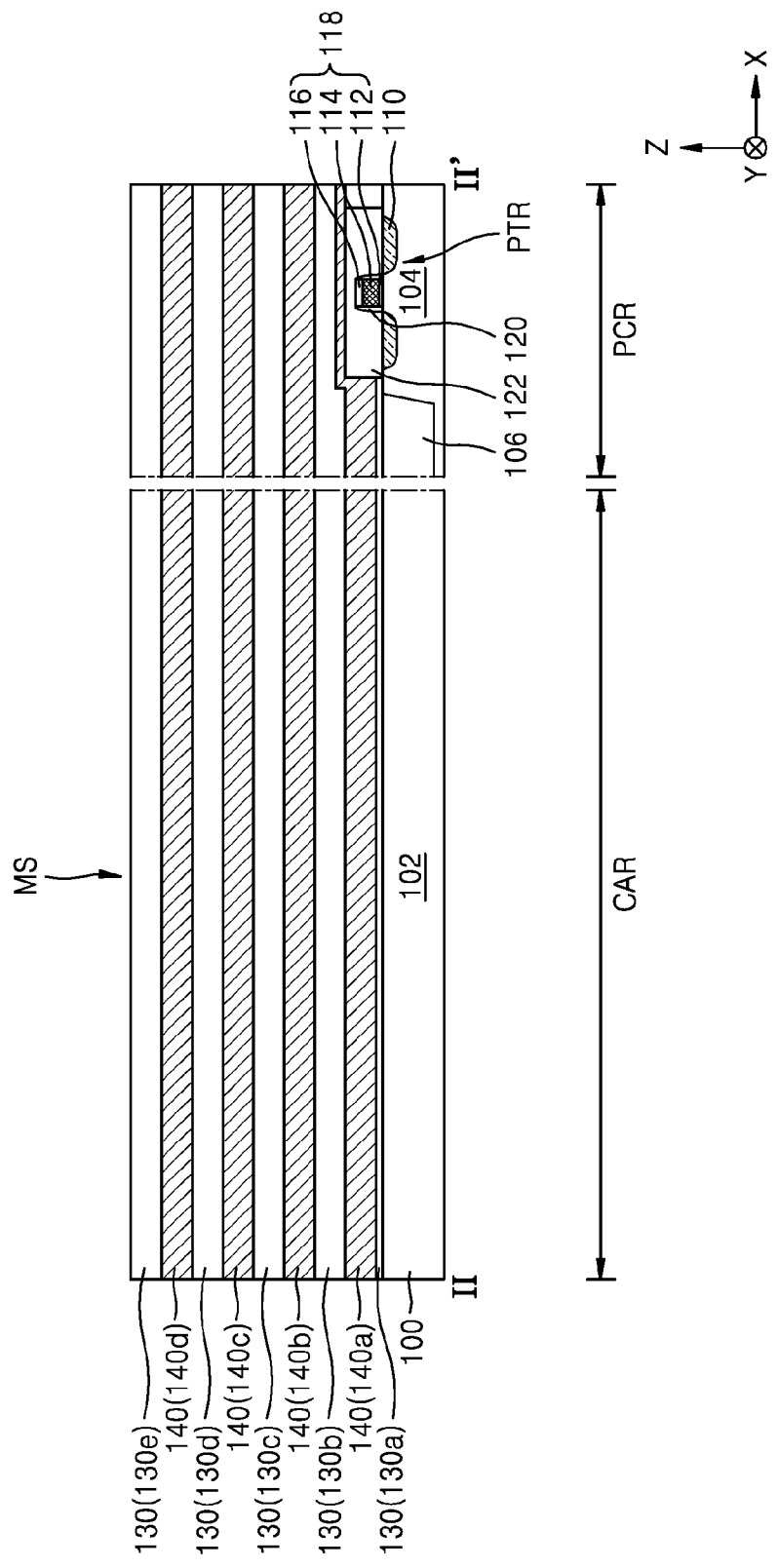

Referring to FIGS. 5A and 5B, a mold structure MS is formed on the substrate 100, which includes the cell array region CAR and the peripheral circuit region PCR, by alternately stacking a plurality of interlayer insulating films 130 (130a, 130b, 130c, 130d, and 130e) and a plurality of sacrificial films 140 (140a, 140b, 140c, and 140d) along a first direction (Z direction) perpendicular to the top surface of the substrate 100.

In some example embodiments, the interlayer insulating films 130 may be formed of an oxide-based material such as silicon oxide, silicon oxycarbide, or fluorinated silicon oxide. The sacrificial films 140 may be formed of a material that has an etching selectivity to the interlayer insulating films 130 and is easily removable by a wet etching process. For example, the sacrificial films 140 may be formed of a nitride-based material such as silicon nitride (SiN) or silicon boron nitride (SiBN).

The interlayer insulating films 130 and the sacrificial films 140 may be formed through a chemical vapor deposition (CVD) process, a plasma enhanced chemical vapor deposition (PECVD) process, or a spin coating process. In some example embodiments, the lowermost interlayer insulating film 130a may be formed by performing a thermal oxidation process on the top surface of the substrate 100. In this case, the lowermost interlayer insulating film 130a may be formed to be thinner than the remaining interlayer insulating films 130b, 130c, 130d, and 130e.

The sacrificial films 140 may be removed through a subsequent process and provide a space in which a ground selection line GSL, a word line WL, and a string selection line SSL are to be formed. Accordingly, the number of stacking of the interlayer insulating films 130 and the sacrificial films 140 may be changed according to the numbers of stacking of the ground selection line GSL, the word line WL, and the string selection line SSL to be formed later. For example, single layers of the ground selection line GSL and the string selection line SSL, and two layers of the word lines WL may be formed. In this case, as illustrated in FIGS. 5A and 5B, four layers of the sacrificial films 140 may be stacked, and five layers of the interlayer insulating films 130 may be stacked. However, the numbers of stacking of the interlayer insulating films 130 and the sacrificial films 140 is not particularly limited. For example, two ground selection lines GSL, two string selection lines SSL, and four, eight, or sixteen word lines WL may be formed. In this case, eight, twelve, or twenty sacrificial films 140 may be formed, and nine, thirteen, or twenty-one interlayer insulating films 130 may be formed. The number of word lines WL may be sixteen or more, for example, $2^n$ (where n is an integer equal to or greater than 4). As illustrated in FIGS. 5A and 5B, the lowermost layer of the mold structure MS may be the lowermost interlayer insulating film 130*a*, and the uppermost layer of the mold structure MS may be the uppermost interlayer insulating film 130*e*. The sacrificial films 140 may be formed between respective the interlayer insulating films 130.

Figure 6:
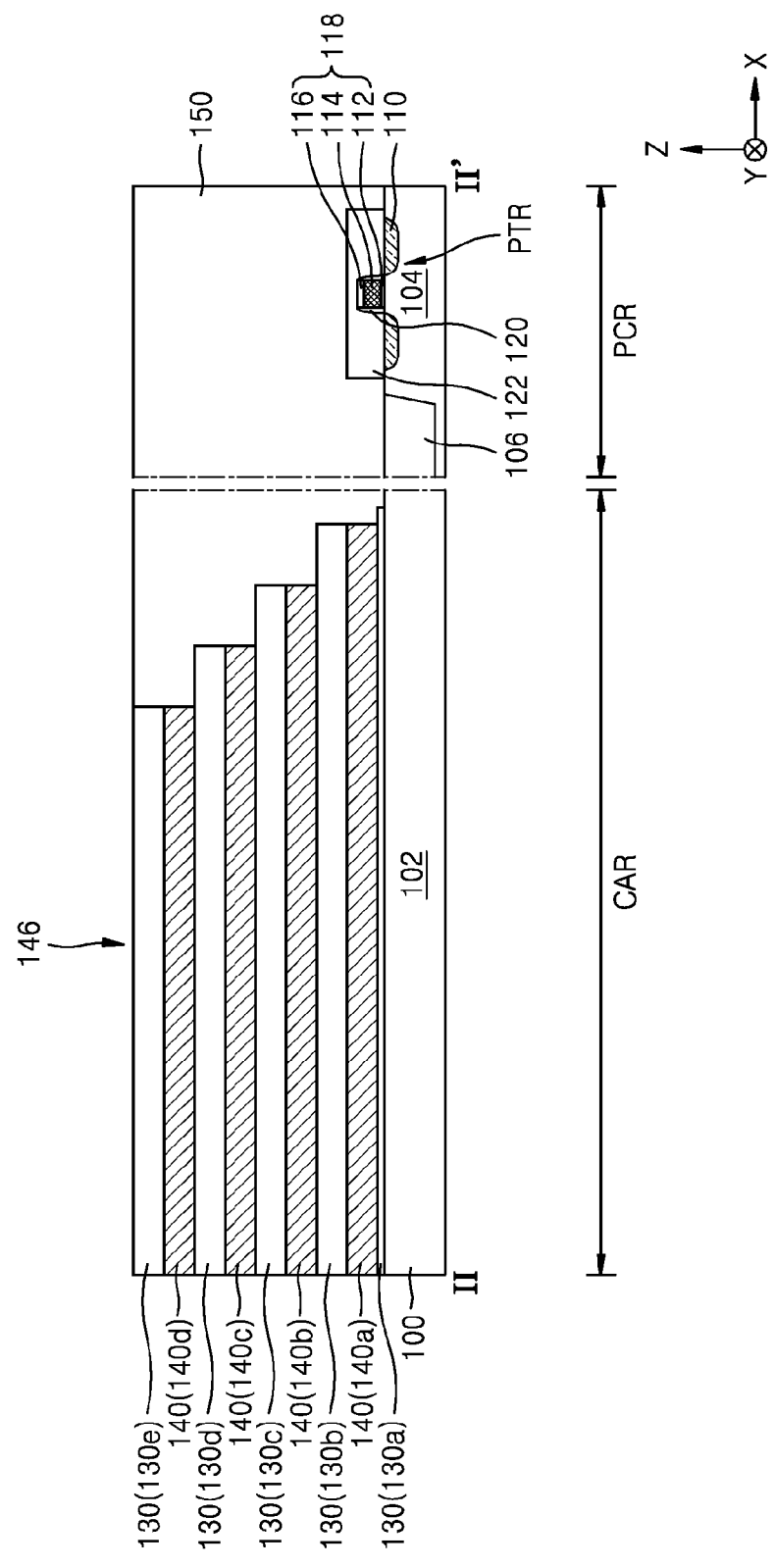

Referring to FIG. 6, a step-shaped mold structure 146 may be formed by partially etching the interlayer insulating films 130 and the sacrificial films 140.

In some example embodiments, a photoresist pattern (not illustrated), which partially covers the interlayer insulating film 130*e*, may be formed on the uppermost interlayer insulating film 130*e*, and both ends of the interlayer insulating films 130*e*, 130*d*, 130*c*, 130*b* and the sacrificial films 140*d*, 140*c*, 140*b*, and 140*a* may be etched by using the photoresist pattern as an etching mask. After the width of the photoresist pattern is reduced by partially removing both ends of the photoresist pattern, both ends of the interlayer insulating films 130*e*, 130*d*, and 130*c* and the sacrificial films 140*d*, 140*c*, and 140*b* may be etched by using the resulting photoresist pattern as an etching mask. Similarly, a step-shaped mold structure 146 as illustrated in FIG. 6 may be formed by repeating an etching process.

In some example embodiments, the interlayer insulating films 130 and the sacrificial films 140, which are formed in a portion of the cell array region CAR and in the peripheral circuit region PCR, may be substantially removed. During the etching process for forming the step-shaped mold structure 146, the transistor formed in the peripheral circuit region PCR may be protected by the peripheral circuit protection film 122. In some example embodiments, the lowermost interlayer insulating film 130*a* formed on the substrate 100 may be partially removed during the etching process. In some example embodiments, the lowermost interlayer insulating film 130*a* may remain without being substantially etched during the etching process.

After the step-shaped mold structure 146 is formed, a mold protection film 150 that covers the side or steps of the step-shaped mold structure 146 may be formed on the substrate 100 including a portion of the cell array region CAR and the peripheral circuit region PCR. For example, an insulating film that covers the step-shaped mold structure 146 is formed on the substrate 100 by using an insulating material such as silicon oxide through a CVD process or a spin coating process. Then, a mold protection film 150 may be formed by planarizing the upper portion of the insulating film until the uppermost interlayer insulating film 130*e* is exposed. The planarization process may include a chemical mechanical polish (CMP) process and/or an etch-back process. In some example embodiments, the mold protection film 150 may be formed of substantially the same material as the interlayer insulating films 130 or a similar material to the interlayer insulating films 130. In this case, the mold protection film 150 may be substantially combined or integrated with the interlayer insulating films 130.

In some example embodiments, the top surface of the step-shaped mold structure 146 may be positioned on substantially the same plane as the top surface of the mold protection film 150.

Figure 7A:
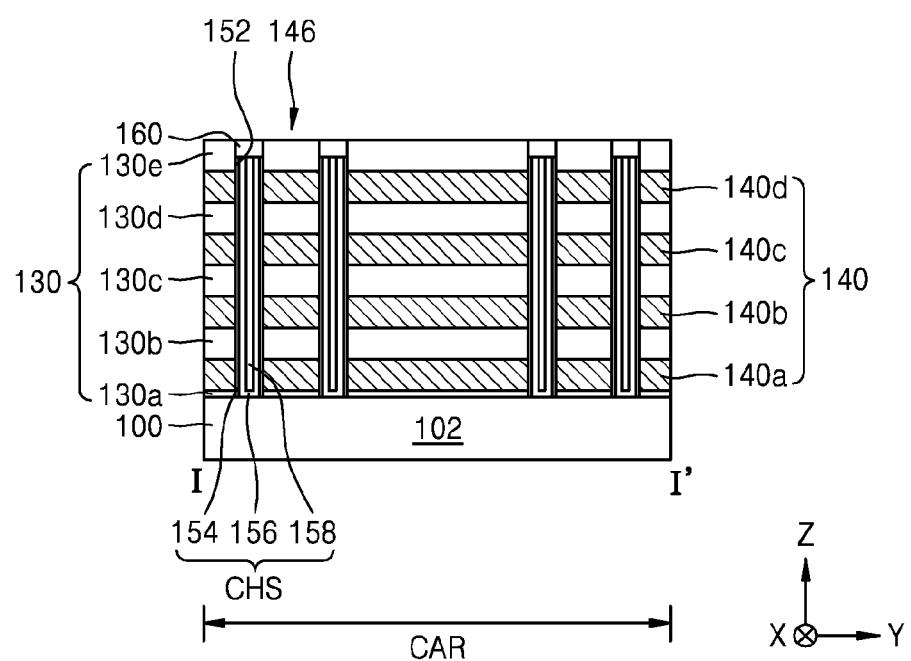
Figure 7B:
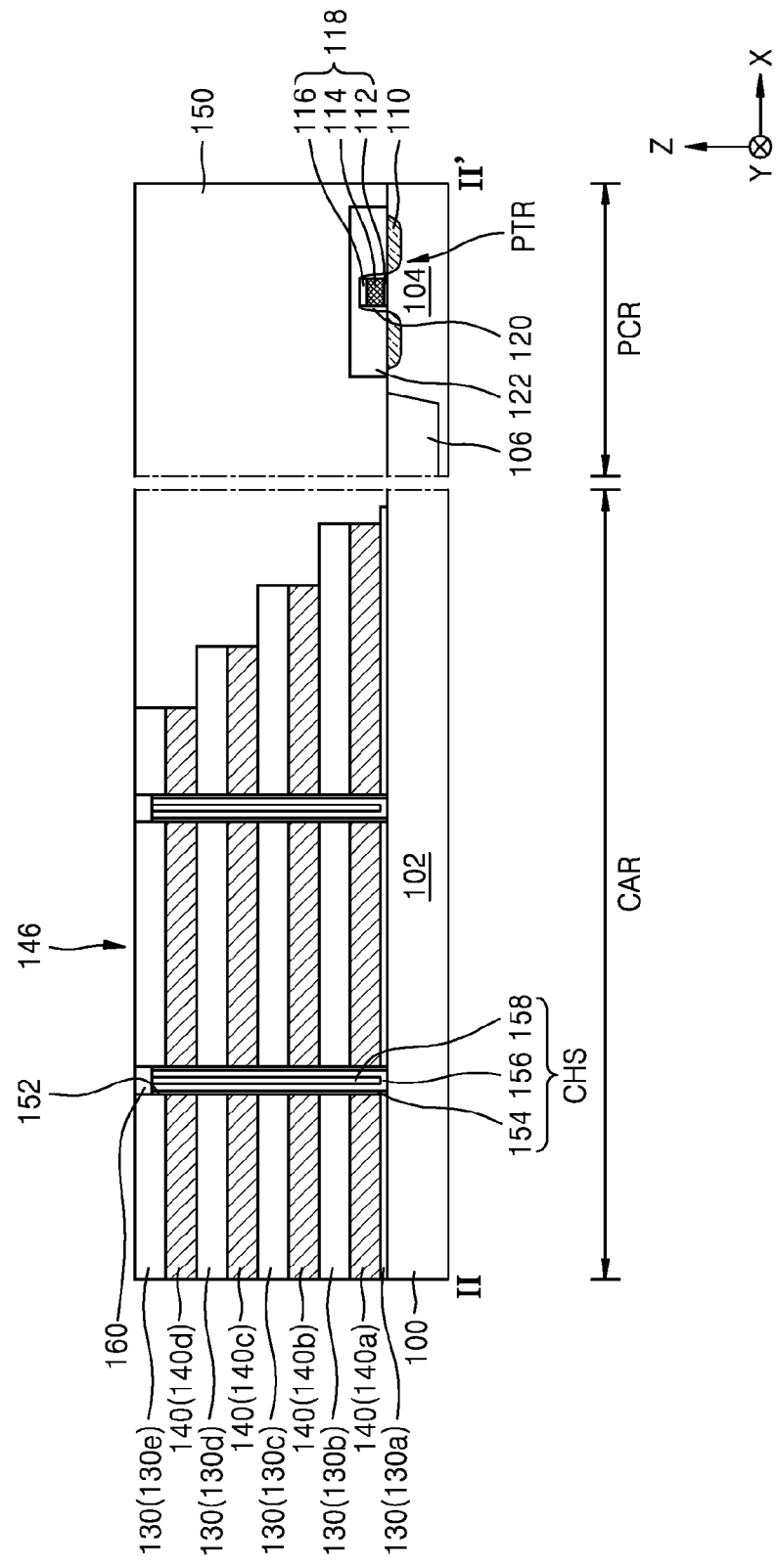

Referring to FIGS. 7A and 7B, a plurality of channel holes 152 are formed to pass through the step-shaped mold structure 146 of the cell array region CAR and extend in the first direction (Z direction) perpendicular to the top surface of the substrate 100.

In some example embodiments, a hard mask (not illustrated) may be formed on the uppermost interlayer insulating film 130*e*, and the channel holes 152 may be formed by etching the interlayer insulating films 130 and the sacrificial films 140 of the step-shaped mold structure 146 through a dry etching process using the hard mask as an etching mask. After the channel holes 152 are formed, the top surface of the substrate 100 may be exposed through the channel holes 152. For example, the hard mask may be formed of a silicon-based or carbon-based spin-on hard mask (SOH) material or photoresist material.

As illustrated in FIGS. 7A and 7B, the plurality of channel holes 152 may be formed in the second direction (X direction) and the third direction (Y direction).

After the channel holes 152 are formed, the hard mask may be removed through an ashing processing and/or a strip process.

In some example embodiments, a vertical channel structure CHS that fills the channel hole 152 may be formed by sequentially stacking a dielectric film structure 154, a channel 156, and a buried film pattern 158 from the sidewall of the channel hole 152.

In some example embodiments, although not illustrated, the dielectric film structure 154 may be formed by sequentially stacking a blocking film, a charge storing film, and a tunnel insulating film. The blocking film may be formed of an oxide such as silicon oxide. The charge storing film may be formed of a nitride, such as silicon nitride, or a metal oxide. The tunnel insulating film may be formed of an oxide such as silicon oxide. For example, the dielectric film structure 154 may be formed to have an ONO structure. The blocking film, the charge storing film, and the tunnel insulating films may be formed through a CVD process, a PECVD process, or an atomic layer deposition (ALD) process.

In some example embodiments, the channel may be formed of doped or undoped polysilicon or amorphous silicon. On the other hand, after the channel 156 is formed of polysilicon or amorphous silicon, polysilicon or amorphous silicon may be converted into single-crystalline silicon by thermal treatment or laser beam irradiation. In a case where polysilicon or amorphous silicon is converted into single-crystalline silicon, a defect in the channel 156 may be removed, thus improving the function of the channel 156. The buried film pattern 158 may be formed of an insulating material such as silicon oxide or silicon nitride. The channel 156 and the buried film pattern 158 may be formed through a CVD process, a PECVD process, a spin coating process, a PVD process, or an ALD process.

The channel 156 may have a cup shape, and the buried film pattern 158 may have a pillar shape or a cylinder shape, the inside of which is fully filled. The dielectric film structure 154 may include the tunnel insulating film, the charge storing film, and the blocking film, which are sequentially stacked from the outer wall of the channel 156.

In some example embodiments, when the channel 156 is formed to fully fill the channel hole 152, the buried film pattern 158 may not be formed.

In some example embodiments, after the channel hole 152 illustrated in FIGS. 7A and 7B is formed, a semiconductor pattern (not illustrated) that fills a lower portion of the channel hole 152 may be formed before the forming of the dielectric film structure 154, the channel 156, and the buried film pattern 158. The semiconductor pattern may be formed through a selective epitaxial growth (SEG) process using the top surface of the substrate 100 as a seed. Accordingly, the semiconductor pattern may include polysilicon or single-crystal silicon. On the contrary, after an amorphous silicon film that fills the lower portion of the channel hole 152 is formed, the semiconductor pattern may be formed by performing a laser epitaxial growth (LEG) process or a solid phase epitaxy (SPE) process on the amorphous silicon film. In this case, the dielectric film structure 154, the channel 156, and the buried film pattern 158 may be formed on the semiconductor pattern.

In some example embodiments, a pad 160 that fills an upper portion of the channel hole 152 may be formed. In an example process of forming the pad 160, a recess may be formed by removing the upper portions of the dielectric film structure 154, the channel 156, and the buried film pattern 158 through an etch-back process. Then, a pad film that fills the recess may be formed on the buried film pattern 158, the channel 156, the dielectric film structure 154, and the uppermost interlayer insulating film pattern 130*e*, and the pad 160 may be formed by planarizing the upper portion of the pad film until the top surface of the uppermost interlayer insulating film pattern 130*e* is exposed. The pad film may be formed of polysilicon or polysilicon doped with n-type impurity. On the contrary, the pad film may be formed by forming an auxiliary pad film of amorphous silicon and crystallizing the auxiliary pad film. The planarization process may include a CMP process.

Figure 8:
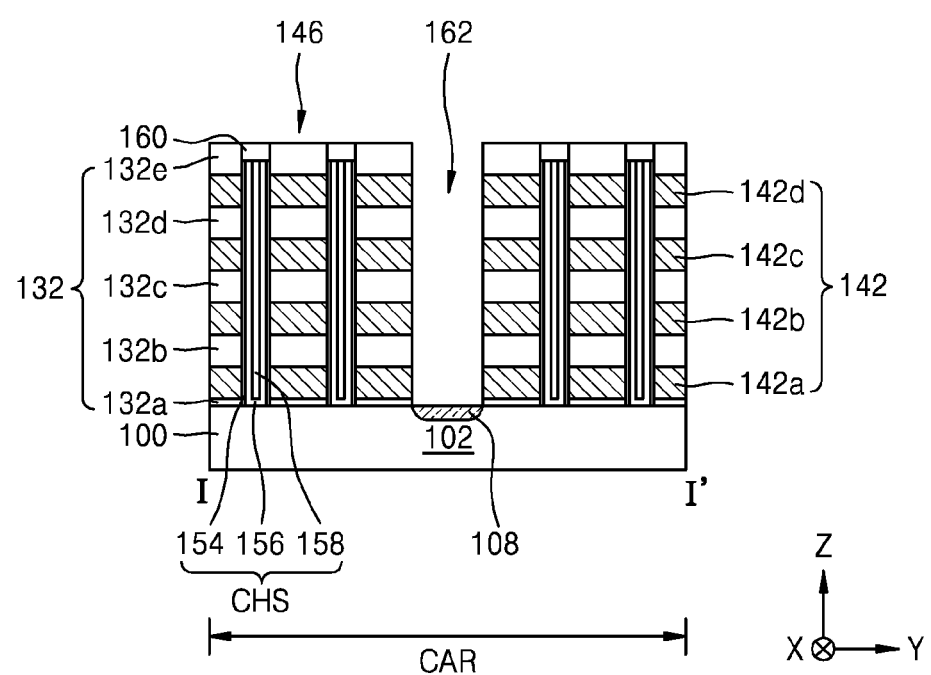

Referring to FIG. 8, an opening 162 for a common source line is formed by partially etching the mold structure 146. The opening 162 for the common source line may pass through the mold structure 146 between the channels 156 and extend in the first direction (Z direction).

In some example embodiments, the opening 162 for the common source line may have a trench shape extending in the second direction (X direction) in the cell array region CAR of the substrate 100. The mold structure 146 may be cut by the opening 162 for the common source line. Accordingly, a predetermined number of the channels 156 may be defined as unit or may be grouped.

In some example embodiments, an impurity implantation process may be performed so as to form a first impurity region 108 on the substrate 100 exposed by the opening 162 for the common source line. For example, the impurity implantation process may be performed by implanting an n-type impurity, such as phosphorus (P) or arsenic (As). The first impurity region 108 may be provided as the common source line CSL extending in the second direction (X direction).

On the other hand, as the opening 162 for the common source line is formed, the interlayer insulating films 130 and the sacrificial films 140 may be respectively converted into interlayer insulating film patterns 132 (132*a*, 132*b*, 132*c*, 132*d*, and 132*e*) and sacrificial film patterns 142 (142*a*, 142*b*, 142*c*, and 142*d*). At this time, the interlayer insulating film patterns 132 and the sacrificial film patterns 142 of the respective layers may extend in the second direction (X direction). In addition, the first impurity region 108, which is formed on the substrate 100 of the cell array region CAR, may be exposed through the opening 162 for the common source line, and the sidewalls of the interlayer insulating film patterns 132 and the sacrificial film patterns 142 may be exposed through the opening 162 for the common source line.

Figure 9A:
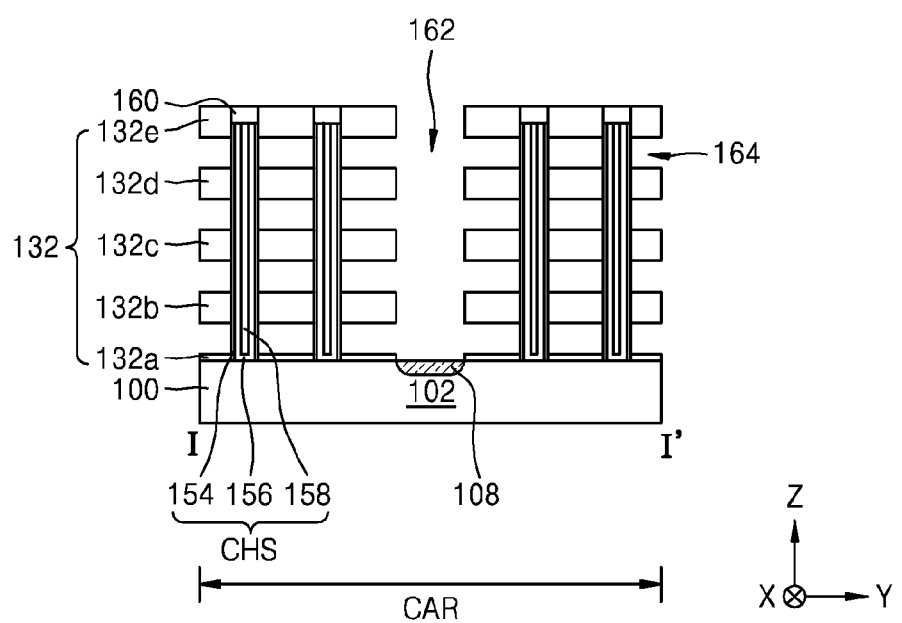
Figure 9B:
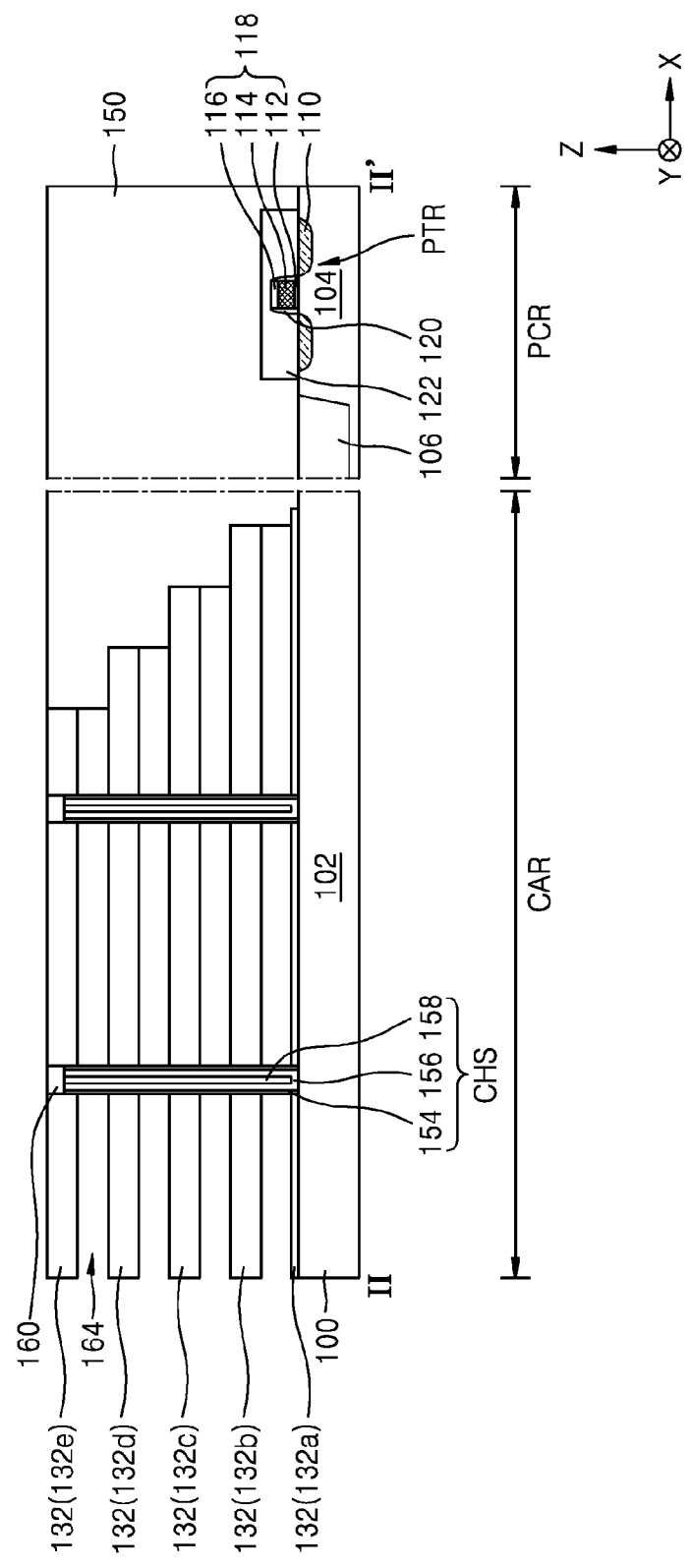

Referring to FIGS. 9A and 9B, the sacrificial film patterns 142 having the sidewalls exposed by the opening 162 for the common source line, are removed. In some example embodiments, the sacrificial film patterns 142 may be removed by a wet etching process using an etching solution through the exposed sidewalls. Examples of the etching solution may include an acid solution such as a phosphoric acid solution or a sulfuric acid solution.

When the sacrificial film patterns 142 are removed, space regions 164 are formed between the interlayer insulating film patterns 132 of the respective layers, and the outer wall of the dielectric film structure 154 may be partially exposed by the space regions 164.

Figure 10A:
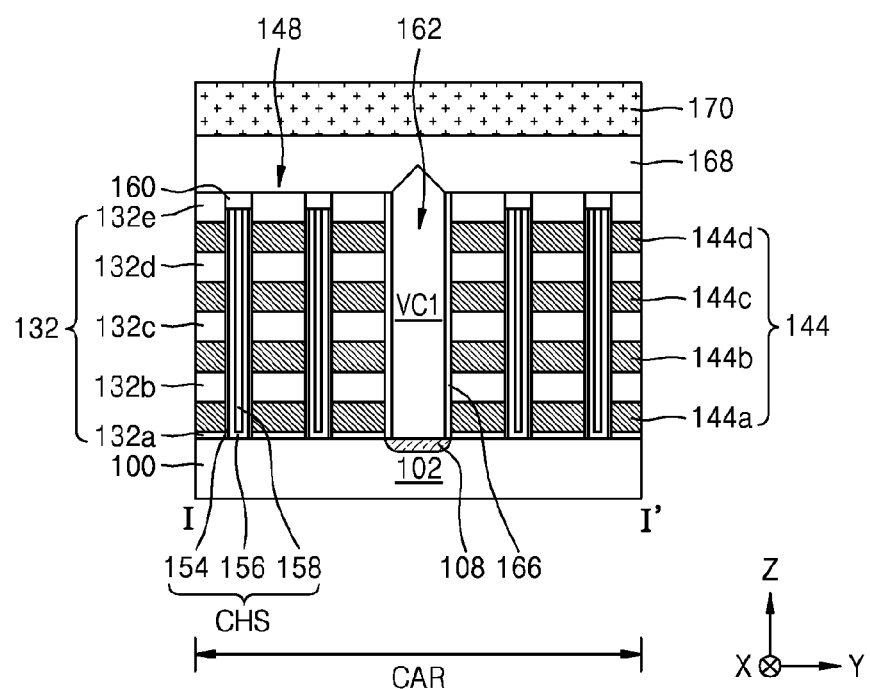
Figure 10B:
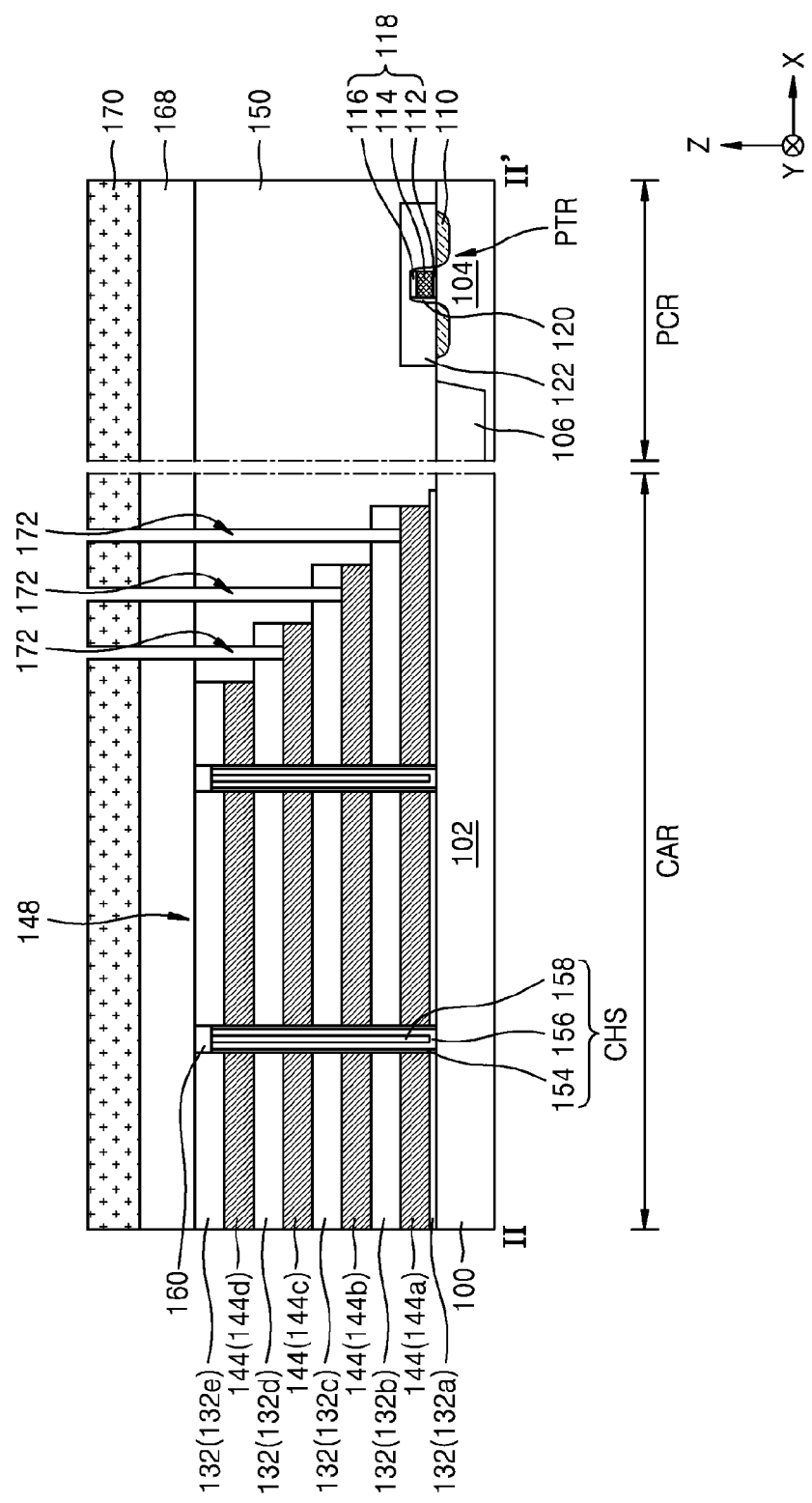

Referring to FIGS. 10A and 10B, cell gate lines 144*a*, 144*b*, 144*c*, and 144*d* may be formed in the space regions 164 of the respective layers. Accordingly, the sacrificial film patterns 142 of the respective layers may be replaced with cell gate line structures 144. In this case, the cell gate lines 144*a*, 144*b*, 144*c*, and 144*d* partially contact the exposed outer wall of the dielectric film structure 154. Accordingly, the cell gate lines 144*a*, 144*b*, 144*c*, and 144*d* may extend in the second direction (X direction) while surrounding the outer walls of the dielectric film structures 154 and the channels 156. Consequently, a cell gate stack structure 148 that includes the interlayer insulating film patterns 132 and the plurality of cell gate line structures 144 may be formed.

In some example embodiments, before the cell gate lines 144*a*, 144*b*, 144*c*, and 144*d* are formed, an additional blocking film (not illustrated) may be further formed of silicon oxide or a metal oxide along the inner walls of the space regions 164 and the surfaces of the interlayer insulating film patterns 132.

In some example embodiments, a separation film pattern 166 may be formed on the sidewall of the opening 152 for the common source line so as to cover the cell gate lines 144*a*, 144*b*, 144*c*, and 144*d* and the interlayer insulating film patterns 132 exposed through the opening 162 for the common source line (see FIG. 9A). The separation film pattern 166 may be formed of an insulating material such as silicon oxide.

In some example embodiments, after the separation film pattern 166 is formed, an impurity implantation process may be additionally performed on the first impurity region 108 through the opening 162 for the common source line.

In some example embodiments, a metal silicide pattern, such as a nickel silicide pattern or a cobalt silicide pattern, may be further formed on the first impurity region 108 so as to reduce the resistance of the common source line CSL.

Figure 11A:
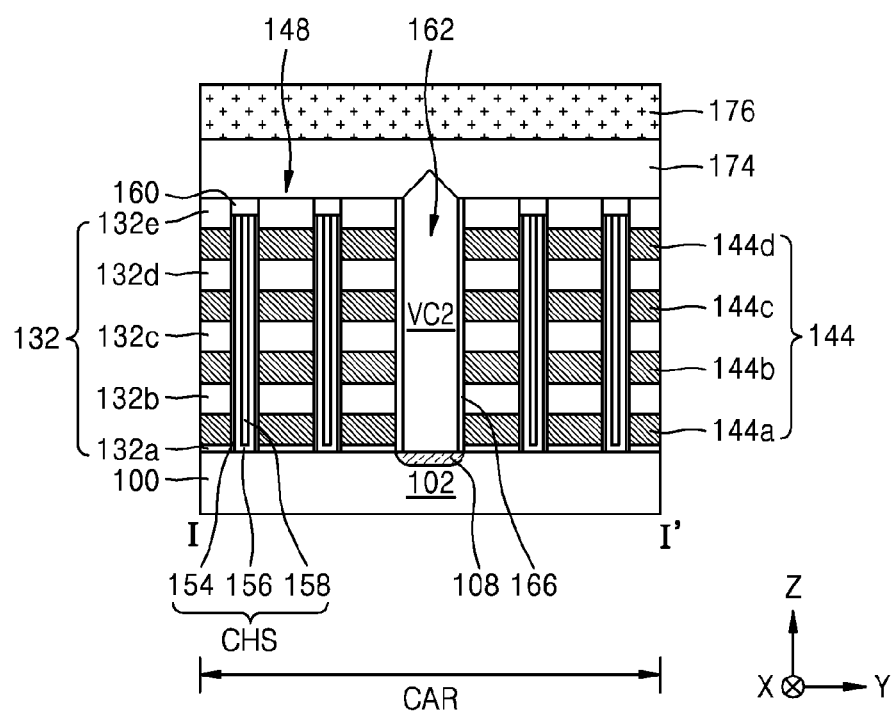
Figure 11B:
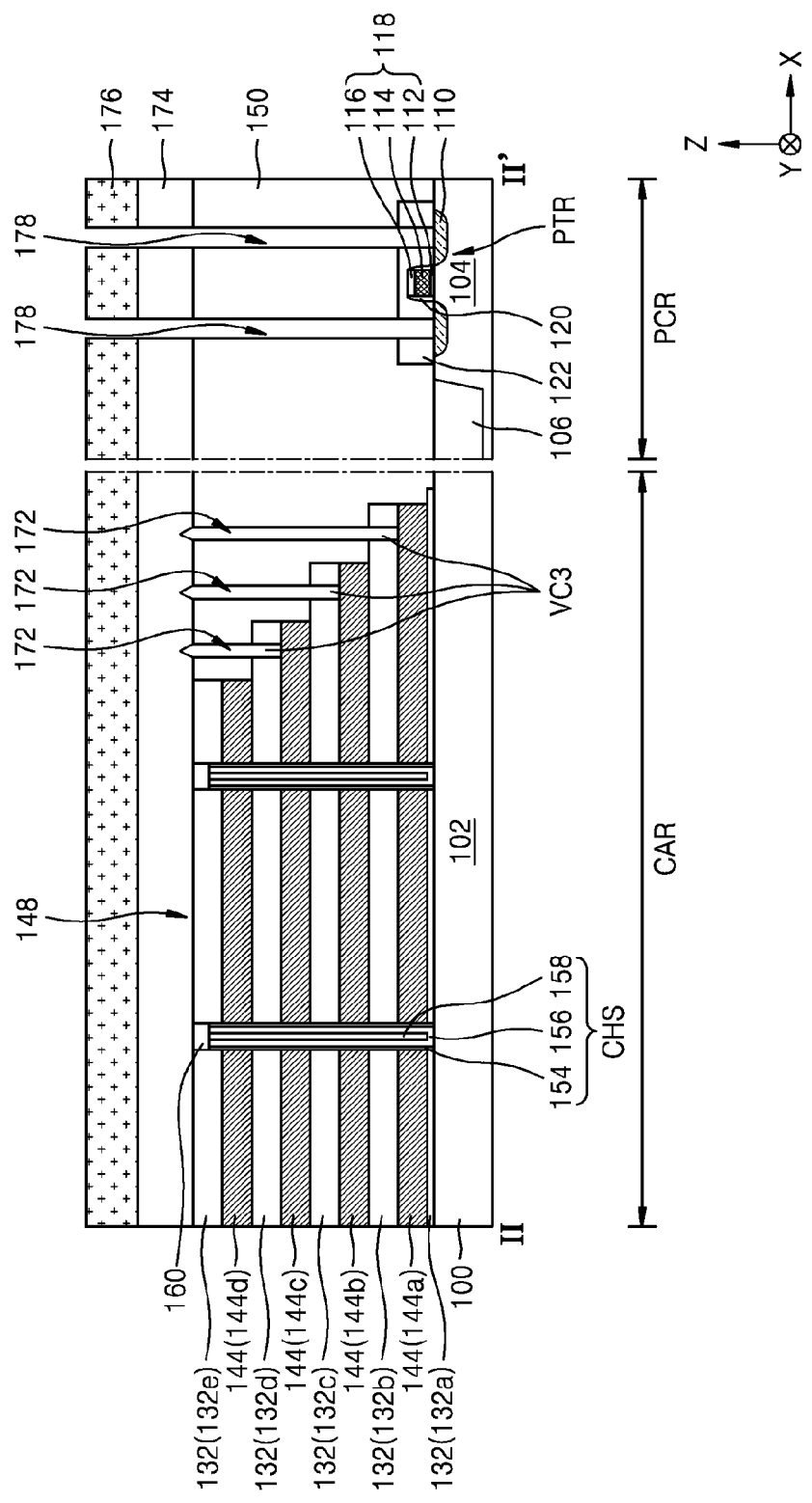

In some example embodiments, a first hard mask pattern 168 and a first photoresist pattern 170 may be formed on the substrate 100 of the cell array region CAR and the peripheral circuit region PCR, and a plurality of cell gate line contact holes 172 may be formed by using the first hard mask pattern 168 as an etching mask. The plurality of cell gate line contact holes 172 may pass through the mold protection film 150 and the interlayer insulating film patterns 132 of the cell array region CAR and extend in the first direction (Z direction). The first hard mask pattern 168 may be formed on the cell gate stack structure 148 of the cell array region CAR and on the mold protection film 150 of the cell array region CAR and the peripheral circuit region PCR. The first hard mask pattern 168 may be formed on the cell gate stack structure 148 while covering the entrance of the opening 162 for the common source line. Accordingly, after the first hard mask pattern 168 is formed, a void VC1 may be formed in the opening 162 for the common source line. For example, the first hard mask pattern 168 may be formed of a silicon-based or carbon-based SOH material or an amorphous carbon layer (ACL). The cell gate line contact holes 172 may be formed by partially etching the mold protection film 150 and the interlayer insulating film patterns 132 of the cell array region CAR so as to partially expose the cell gate lines 144a, 144b, 144c, and 144d of the respective layers. Among the plurality of cell gate line contact holes 172, a cell gate line contact hole that exposes the uppermost cell gate line 144d is not illustrated in FIG. 10B for convenience, but the plurality of cell gate line contact holes 172 may include the cell gate line contact hole that exposes the uppermost cell gate line 144d. Referring to FIGS. 11A and 11B, after the first hard mask pattern 168 and the first photoresist pattern 170 are removed from the substrate 100, a second hard mask pattern 174 and a second photoresist pattern 176 may be formed on the substrate 100 of the cell array region CAR and the peripheral circuit region PCR, and a peripheral circuit contact hole 178 may be formed by etching the mold protection film 150 and the peripheral circuit protection film 122 of the peripheral circuit region PCR by using the second photoresist pattern 176 and the second hard mask pattern 174 as an etching mask. The peripheral circuit contact hole 178 may pass through the mold protection film 150 and the peripheral circuit protection film 122 and extend in the first direction (Z direction).

The second hard mask pattern 174 may be formed on the cell gate stack structure 148 of the cell array region CAR and the mold protection film 150 of the cell array region CAR and the peripheral circuit region PCR. The second hard mask pattern 174 may be formed on the cell gate stack structure 148 while covering the entrance of the opening 162 for the common source line. Accordingly, after the second hard mask pattern 174 is formed, a void VC2 may be formed in the opening 162 for the common source line.

The second hard mask pattern 174 may be formed on mold protection film 150 while covering the cell gate line contact holes 172. Accordingly, after the second hard mask pattern 174 is formed, a void VC3 may be formed in the cell gate line contact hole 172. For example, the second hard mask pattern 174 may be formed of a silicon-based or carbon-based SOH material or an ACL.

The peripheral circuit contact hole 178 may be formed by partially etching the mold protection film 150 and the peripheral circuit protection film 122 of the peripheral circuit region PCR so as to partially expose the second impurity region 110 formed in the substrate 100 of the second active area 104 of the peripheral circuit region PCR.

Figure 12A:
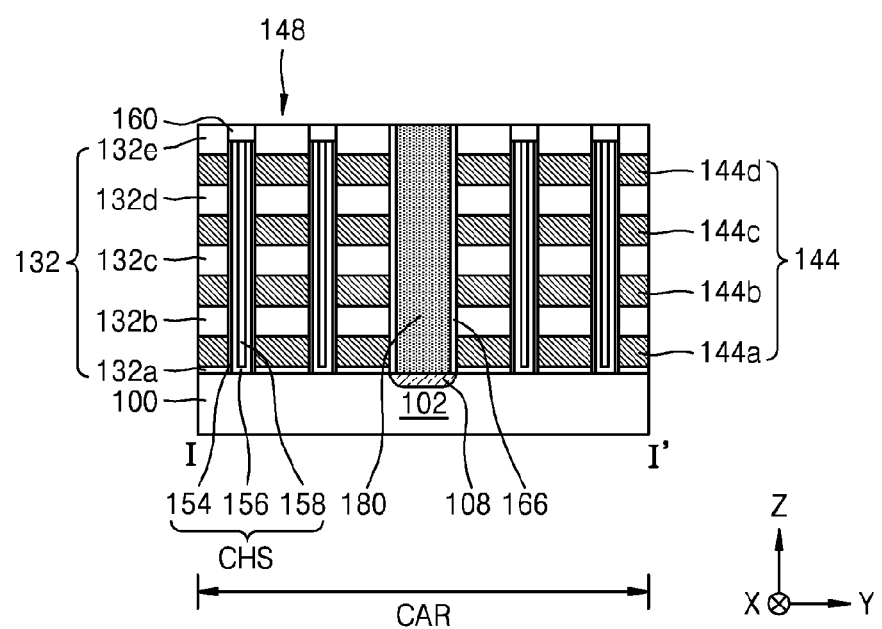
Figure 12B:
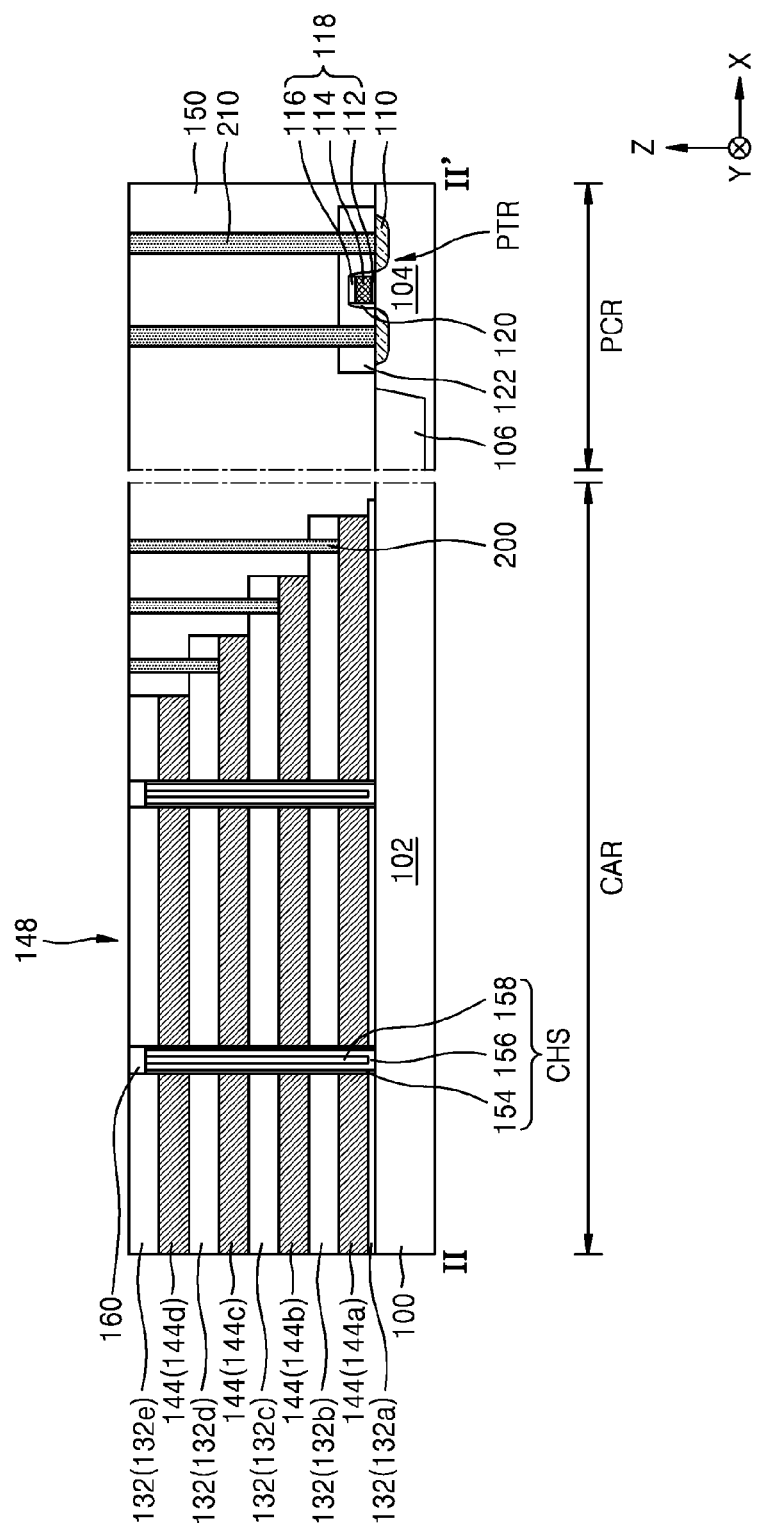

Referring to FIGS. 12A and 12B, after the second photoresist pattern 176 and the second hard mask pattern 174 are removed, a common source line contact plug 180, cell gate line contact plugs 200, and peripheral circuit contact plugs 210 may be respectively formed in the opening 162 for the common source line, the cell gate line contact holes 172, and the peripheral circuit contact holes 178.

The bottom surface of the common source line contact plug 180 may contact the first impurity region 108, and the outer wall of the common source line contact plug 180 may contact the separation film pattern 166. The common source line contact plug 180 may have a line shape extending in the second direction (X direction). The common source line contact plug 180 may serve as a cell gate line cut pattern that separates the plurality of cell gate line structures 144 from one another in the cell gate stack structure 148.

The cell gate line contact plugs 200 may pass through the mold protection film 150 and the interlayer insulating film patterns 132 and contact the cell gate lines 144a, 144b, 144c, and 144d, respectively.

The peripheral circuit contact plug 210 may pass through the mold protection film 150 and the peripheral circuit protection film 122 and contact the second impurity region 110.

In some example embodiments, the common source line contact plug 180, the cell gate line contact plug 200, and the peripheral circuit contact plug 210 may be formed substantially at the same time. An example process for forming the common source line contact plug 180, the cell gate line contact plug 200, and the peripheral circuit contact plug 210 at the same time may include forming a conductive film on the substrate 100 so as to fill the contact holes 162, 172, and 178 and planarizing the conductive film through a CMP process and/or an etch-back process so as to expose the top surface of the cell gate stack structure 148 or the mold protection film 150. For example, the conductive film may be formed of a conductive material, such as a metal nitride or doped polysilicon, through a CVD process, an ALD process, or a sputtering process.

In some example embodiments, the top surfaces of the common source line contact plug 180, the cell gate line contact plugs 200, and the peripheral circuit contact plugs 210 may be positioned on substantially the same plane as the top surface of the cell gate stack structure 148 and/or the mold protection film 150. In some example embodiments, the top surfaces of the common source line contact plug 180, the cell gate line contact plugs 200, and the peripheral circuit contact plugs 210 may be positioned on substantially the same plane as the top surface of the mold structure 146 of FIG. 6.

In some example embodiments, the process of forming the contact holes 162, 172, and 178 may include forming the opening 162 for the common source line, as described above with reference to FIG. 8, and forming the cell gate line contact holes 172 and the peripheral circuit contact holes 178 at the same time, contrary to that described above with reference to FIGS. 10A to 11B. To this end, in a manner similar to the process of forming the first hard mask pattern 168 as described above with reference to FIGS. 10A and 10B, a hard mask pattern may be formed on the substrate 100 so as to form a void VC1 in the opening 162 for the common source line, and the cell gate line contact holes 172 and the peripheral circuit contact holes 178 may be formed at the same time by etching the interlayer insulating film patterns 132, the mold protection film 150, and the peripheral circuit protection film 122 of the respective layers by using the hard mask pattern as an etching mask.

In some example embodiments, the process of forming the contact holes 162, 172, and 178 may include forming the opening 162 for the common source line and the gate line contact holes 172, forming a hard mask pattern similar to the second hard mask pattern 174 of FIGS. 11A and 11B on the substrate 100 so as to form voids VC2 and VC3 in the opening 162 for the common source line and the gate line contact hole 172, and forming the peripheral circuit contact hole 178 by using the hard mask pattern.

In some example embodiments, the opening 162 for the common source line, the cell gate line contact holes 172, and the peripheral circuit contact holes 178 may be formed at the same time.

Then, as illustrated in FIGS. 2, 3A, and 3B, cell gate line contact wirings 214 that are electrically connectable to the cell gate line contact plugs 200 may be formed on the mold protection film 150. Peripheral circuit contact wirings 216 that are electrically connectable to the peripheral circuit contact plugs 210 may be formed on the mold protection film 150.

A first upper insulating film 212 may be formed on the cell gate stack structure 148 and the mold protection film 150. The first upper insulating film 212 may include, for example, an insulating material such as silicon oxide.

A first connection contact 222 that passes through the first upper insulating film 212 and contacts the cell gate line contact wiring 214 may be formed. A second connection contact 223 that passes through the first upper insulating film 212 and contacts the peripheral circuit contact wiring 216 may be formed. A connection wiring 224 that connects the first connection contact 222 and the second connection contact 223 may be formed on the first upper insulating film 212.

Auxiliary bit line contacts 218 that pass through the first upper insulating film 212 and contact the pads 160 and auxiliary bit lines 220 that contact the auxiliary bit line contacts 218 may be formed on the first upper insulating film 212.

A second upper insulating film 226 that covers the auxiliary bit lines 220 or the connection wirings 224 may be formed on the first upper insulating film 212.

Bit line contacts 228 that pass through the second upper insulating film 226 and contact the auxiliary bit lines 220 may be formed, and bit lines 230 that contact the bit line contacts 228 on the second upper insulating film 226 may be formed. The bit lines 230 may extend in the third direction (Y direction) and be electrically connected to the plurality of pads 160 through the bit line contacts 228, the auxiliary bit lines 220, and the auxiliary bit line contacts 218. A plurality of bit lines 230 may be formed in the second direction (X direction).

Figure 13:
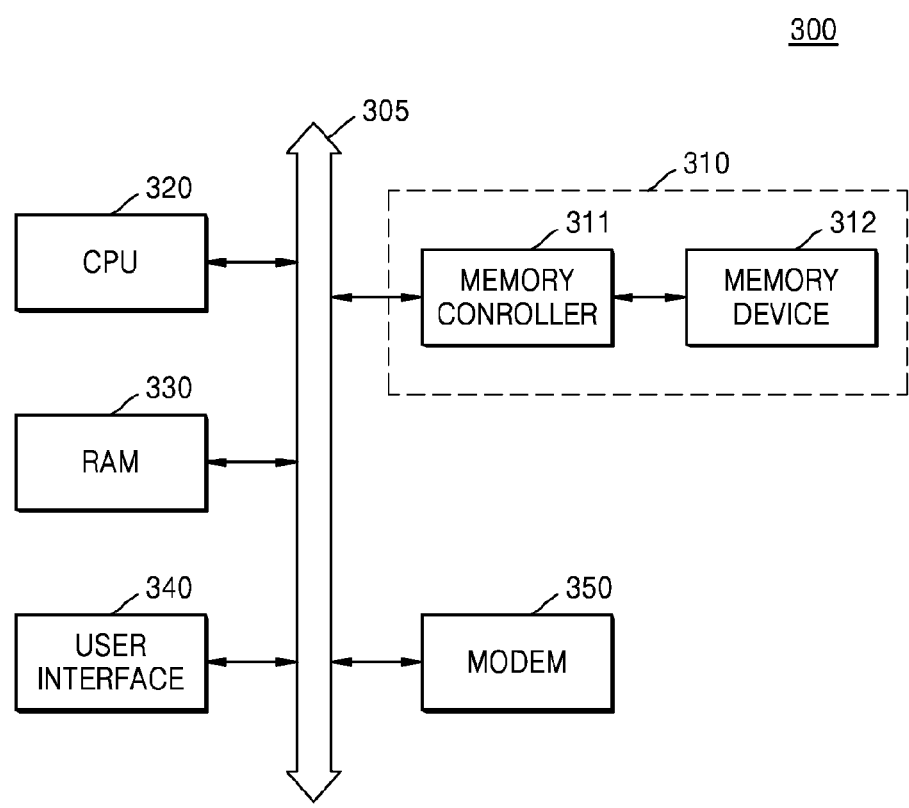
FIG. 13 is a block diagram of an information processing system, according to example embodiments.

FIG. 13 is a block diagram of an information processing system 300, according to example embodiments.

Referring to FIG. 13, the information processing system 300 may include a memory system 310, a central processing unit (CPU) 320, a random access memory (RAM) 330, a user interface 340, and a modem 350 such as a baseband chipset, each of which is electrically connected to a system bus 305. The memory system 310 may include a memory controller 311 and a memory device 312. The memory device 312 may include the vertical memory device, which has been described above with reference to FIGS. 1 to 12B, according to the example embodiments. Therefore, data processed in the CPU 320 or high-capacity data input from the outside may be stably stored. The memory controller 311 is configured to control the memory device 312. The memory system 310 may be provided as a memory card or a semiconductor disk device, such as a solid state disk (SSD), by a combination of the memory device 312 and the memory controller 311. In a case where the information processing system 300 is a mobile device, a battery (not illustrated) may be further provided so as to supply an operating voltage to the information processing system 300. Although not illustrated, the information processing system 300 according to the example embodiments may further include an application chipset, a camera image processor (CIP), and a mobile DRAM.

The methods of manufacturing the vertical memory device according to example embodiments may simplify the manufacturing process by simultaneously forming at least some of the common source line contact plug, the cell gate line contact plugs, and the peripheral circuit contact plugs. Therefore, it is possible to reduce the manufacturing cost of the vertical memory device. Furthermore, it is possible to implement a high-reliability vertical memory device from which a defect of the common source line contact plug is removed.

While the inventive concept has been particularly shown and described with reference to example embodiments thereof, it will be understood that various changes in form and details may be made therein without departing from the spirit and scope of the following claims.

What is claimed is:

1. A method of manufacturing a vertical memory device, the method comprising:
    providing a substrate including a cell array region and a peripheral circuit region;
    forming a mold structure on the cell array region of the substrate, the mold structure having a first portion and a second portion integrally connected to the first portion, the second portion having a plurality of steps;
    forming an insulating layer on the second portion of the mold structure;
    forming a common source line opening, the common source line opening extending through the first portion and the second portion of the mold structure in a first direction, the first direction being perpendicular to an upper surface of the substrate;
    forming cell gate line contact holes extending-through the insulating layer in the first direction to the plurality of steps, each step of the plurality of steps being exposed by at least one of the cell gate line contact holes; and
    simultaneously forming a first contact plug in the common source line opening and second contact plugs in the cell gate line contact holes,
    wherein an upper surface of the first contact plug is substantially coplanar with upper surfaces of the second contact plugs.

2. The method of claim 1, wherein
    the insulating layer has an upper surface that is substantially coplanar with an upper surface of the mold structure.

3. The method of claim 1, wherein the mold structure includes a plurality of interlayer insulating films and a plurality of sacrificial films that are alternately stacked on the cell array region of the substrate along the first direction.

4. The method of claim 3, wherein
    forming the common source line opening includes forming a plurality of interlayer insulating film patterns and a plurality of sacrificial film patterns from the plurality of interlayer insulating films and the plurality of sacrificial films, respectively, and
    the method further includes
        removing the plurality of sacrificial film patterns to form one or more space regions between the interlayer insulating film patterns; and
        forming a plurality of cell gate lines in the space regions.

5. The method of claim 4, wherein the cell gate line contact holes extend through the insulating layer and the plurality of interlayer insulating film patterns on the cell array region of the substrate, the cell gate line contact holes partially exposing the plurality of cell gate lines.

6. The method of claim 5, further comprising:
forming a first hard mask pattern on the substrate such that a first void is formed in the common source line opening;
forming the cell gate line contact holes based on using the first hard mask pattern as a first etching mask; and
removing the first hard mask pattern from the substrate.

7. The method of claim 4, further comprising:
forming a separation film pattern on a sidewall of the common source line opening to cover one or more sidewalls of the plurality of cell gate lines.

8. The method of claim 7, further comprising:
forming an impurity region on an exposed upper portion of the substrate, the upper portion of the substrate exposed by the common source line opening,
wherein forming the impurity region includes
implementing a primary impurity implantation process subsequent to forming the common source line opening, and
implementing a second impurity implantation process subsequently to forming the separation film pattern.

9. The method of claim 4, further comprising:
forming a plurality of channels extending through the mold structure in the first direction,
wherein the plurality of cell gate lines surround the plurality of channels.

10. The method of claim 9, wherein the common source line opening extends between the channels.

11. The method of claim 9, further comprising:
forming a dielectric film between the plurality of channels and the plurality of cell gate lines.

12. A method of manufacturing a vertical memory device, the method comprising:
providing a substrate, the substrate including a cell array region and a peripheral circuit region;
forming a mold structure on the cell array region of the substrate such that the peripheral circuit region of the substrate remains exposed, the mold structure having a first portion and a second portion integrally connected to the first portion, the second portion having a plurality of steps;
forming an insulating layer on the second portion of the mold structure and on the peripheral circuit region of the substrate;
forming a common source line opening, the common source line opening extending through the first portion and the second portion of the mold structure in a first direction, the first direction being perpendicular to an upper surface of the substrate;
forming a plurality of cell gate line contact holes extending through the insulating layer in the first direction to the plurality of steps, each of the plurality of steps being exposed by at least one of the cell gate line contact holes;
forming a peripheral circuit contact hole extending through the insulating layer on the peripheral circuit region, the peripheral circuit contact hole extending in the first direction; and
simultaneously forming a common source line contact plug in the common source line opening, a plurality of cell gate line contact plugs in the plurality of cell gate line contact holes, and a peripheral circuit contact plug in the peripheral circuit contact hole,
wherein an upper surface of the first contact plug is substantially coplanar with upper surfaces of the cell gate line contact plugs and upper surface of the peripheral circuit contact plug.

13. The method of claim 12, wherein the common source line opening extends in a second direction, the second direction being perpendicular to the first direction.

14. The method of claim 12, wherein the upper surface of the common source line contact plug, the upper surface of each cell gate line contact plug, and the upper surface of the peripheral circuit contact plug are substantially coplanar with at least one of an upper surface of the mold structure and an upper surface of the insulating layer.

15. The method of claim 12, wherein,
the mold structure includes a plurality of interlayer insulating films and a plurality of sacrificial films that are alternately stacked on the cell array region of the substrate along the first direction,
forming the common source line opening includes forming a plurality of interlayer insulating film patterns and a plurality of sacrificial film patterns from the plurality of interlayer insulating films and the plurality of sacrificial films, respectively, and
the method further includes,
removing the plurality of sacrificial film patterns to form space regions between the interlayer insulating film patterns; and
forming a plurality of cell gate lines in the space regions.

16. The method of claim 15, wherein the plurality of cell gate line contact holes extend through the insulating layer and the plurality of interlayer insulating film patterns on the cell array region of the substrate, the plurality of cell gate line contact holes partially exposing the plurality of cell gate lines.

17. The method of claim 16, further comprising:
forming a first hard mask pattern on the substrate such that a first void is formed in the common source line opening;
forming the plurality of cell gate line contact holes based on using the first hard mask pattern as a first etching mask;
removing the first hard mask pattern from the substrate;
forming a second hard mask pattern on the substrate such that a second void is formed in the common source line opening and a third void is formed in at least one of the plurality of cell gate line contact holes; and
forming the peripheral circuit contact hole based on using the second hard mask pattern as a second etching mask.

18. The method of claim 16, further comprising:
forming a first hard mask pattern on the substrate such that a first void is formed in the common source line opening; and
simultaneously forming the plurality of cell gate line contact holes and the peripheral circuit contact hole based on using the first hard mask pattern as an etching mask.

19. The method of claim 16, further comprising:
forming a first hard mask pattern on the substrate such that a first void is formed in the common source line opening and a second void is formed in at least one of the plurality of cell gate line contact holes; and
forming the peripheral circuit contact hole based on using the first hard mask pattern as an etching mask.

20. The method of claim 16, wherein,
simultaneously forming the common source line contact plug, the plurality of cell gate line contact plugs, and the peripheral circuit contact plug includes,
forming a conductive layer that fills the common source line opening, the plurality of cell gate line contact holes, and the peripheral circuit contact hole; and
planarizing the conductive layer to expose at least one of an upper surface of the mold structure and an upper surface of the insulating layer.

* * * * *